United States Patent [19]

Watanabe et al.

[11] Patent Number: 5,641,593

[45] Date of Patent: Jun. 24, 1997

[54] LITHOGRAPHIC MASK AND EXPOSURE APPARATUS USING THE SAME

[75] Inventors: Yutaka Watanabe, Isehara; Masami Hayashida, Yokohama, both of Japan

[73] Assignee: Canon Kabushiki Kaisha, Tokyo, Japan

[21] Appl. No.: 592,607

[22] Filed: Jan. 26, 1996

Related U.S. Application Data

[63] Continuation of Ser. No. 322,166, Oct. 13, 1994.

[30] Foreign Application Priority Data

Oct. 15, 1993 [JP] Japan .................................. 5-258085

[51] Int. Cl.$^6$ ...................................................... G03F 9/00
[52] U.S. Cl. ................ 430/5; 430/312; 430/313; 430/324; 430/394; 378/34; 378/35
[58] Field of Search .................. 430/5, 312, 313, 430/324, 394; 378/34, 35

[56] References Cited

U.S. PATENT DOCUMENTS 4,890,309  12/1989  Smith et al. .............................. 378/35
5,328,784   7/1994  Fukuda ................................... 430/321
5,399,448   3/1995  Nagata et al. ............................. 430/5

FOREIGN PATENT DOCUMENTS 01175736  7/1989  Japan .............................. H01L 21/30
04118914  4/1992  Japan ............................. H01L 21/027

OTHER PUBLICATIONS

Atomic Data and Nuclear Data Tables 27, 1–144, 1–82 (1982), B. L. Henke et al., "Low–Energy X–Ray Interaction Coefficients: Photoabsorption, Scattering, and Reflection.".

*Primary Examiner*—S. Rosasco
*Attorney, Agent, or Firm*—Fitzpatrick, Cella, Harper & Scinto

[57] ABSTRACT

A reflection type mask includes a reflective portion effective to reflect soft X-rays or vacuum ultraviolet rays, and an absorbent material pattern formed on the reflecting portion, wherein, when the wavelength of the soft X-rays or vacuum ultraviolet rays is denoted by $\lambda$ and the optical constant of the material constituting the absorbent material pattern is denoted by $1-\delta-ik$ (where $\delta$ and $k$ are real numbers while $i$ is an imaginary number), a relation $0.29 < k/|\delta| < 1.12$ is satisfied, and wherein the thickness $d$ of the absorbent pattern satisfies a relation $3\delta/(16|\delta|) < d < 5\lambda/(16|\delta|)$.

15 Claims, 19 Drawing Sheets

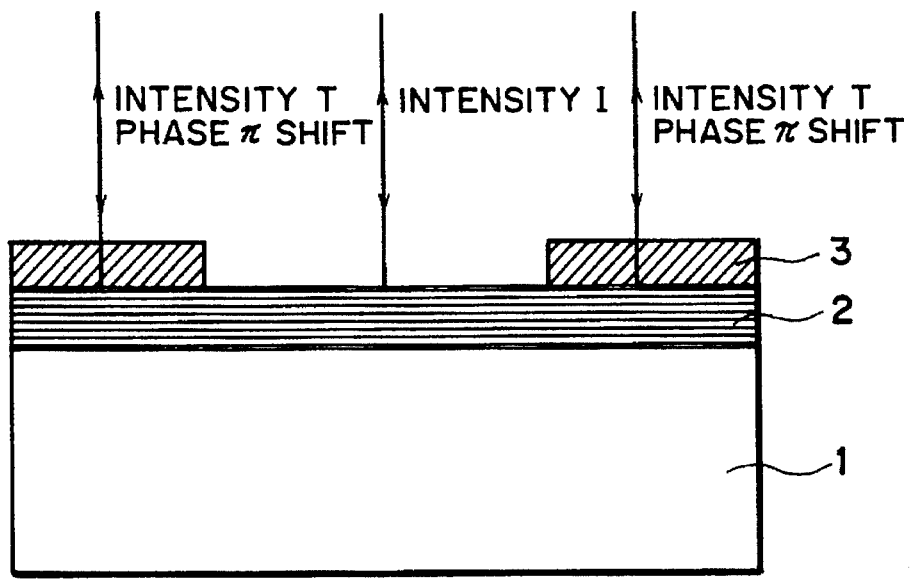
F I G. 3
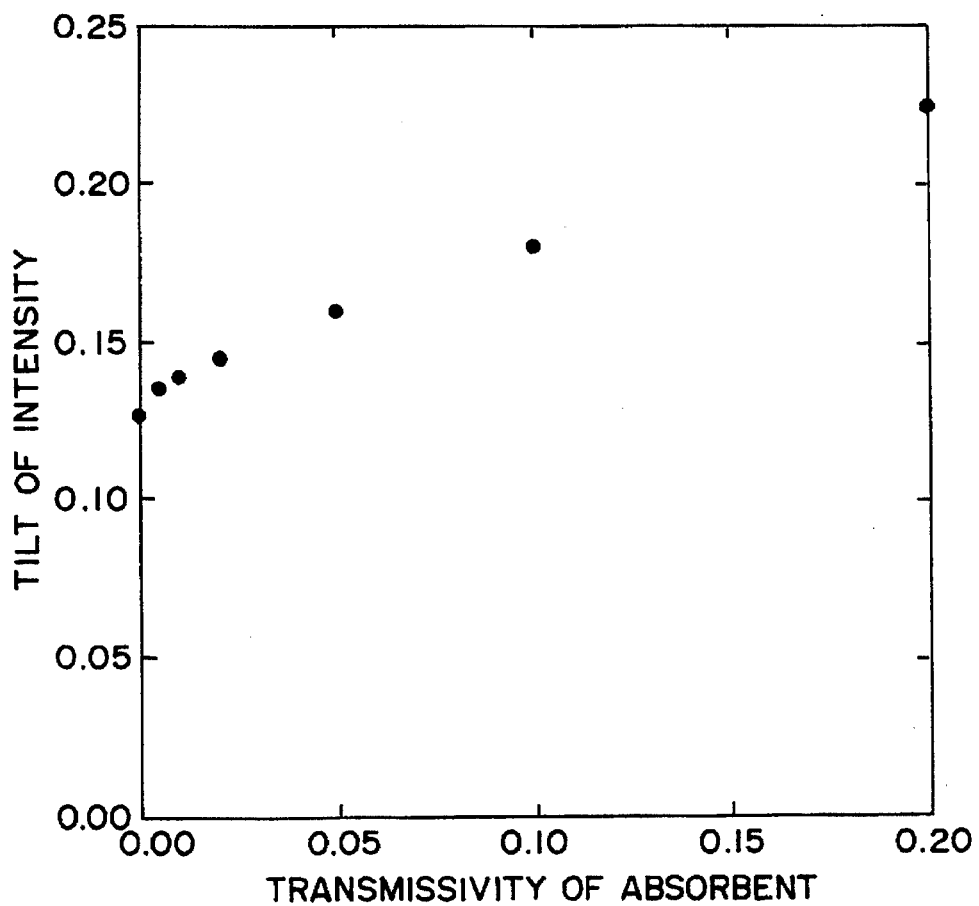
F I G. 4

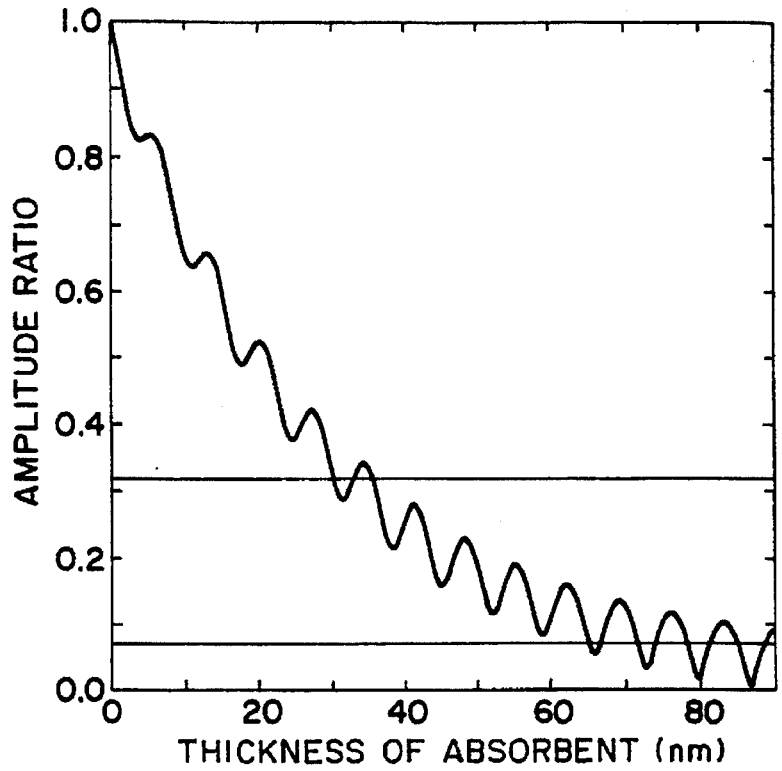
F I G. 7A
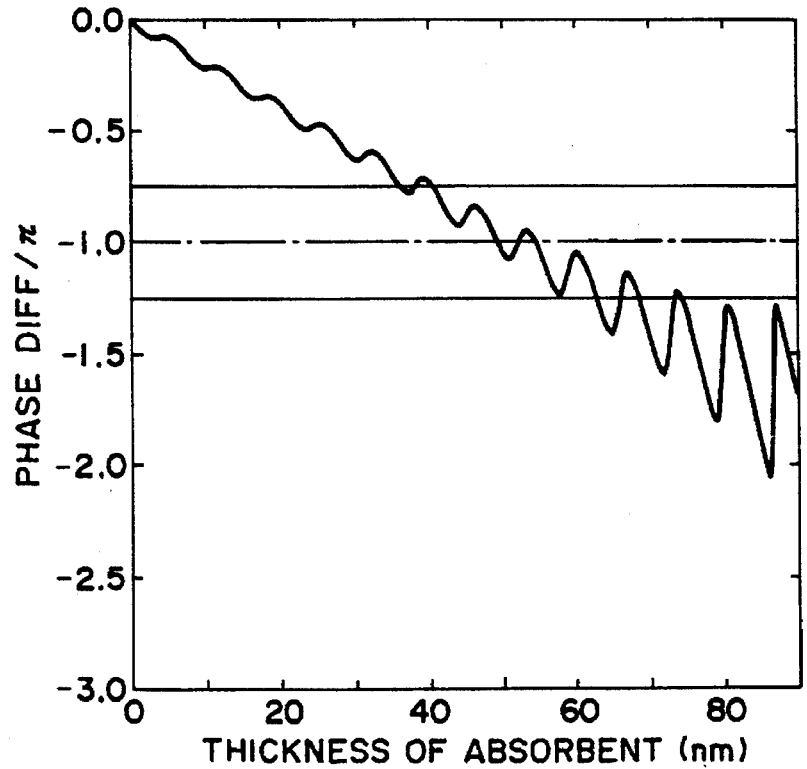
F I G. 7B

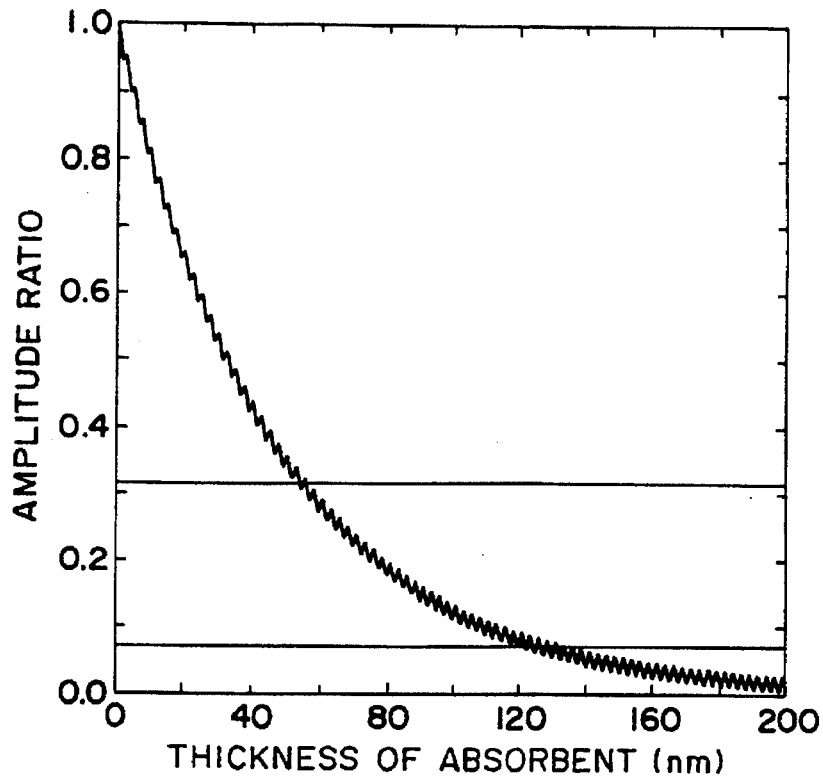
F I G. 15A
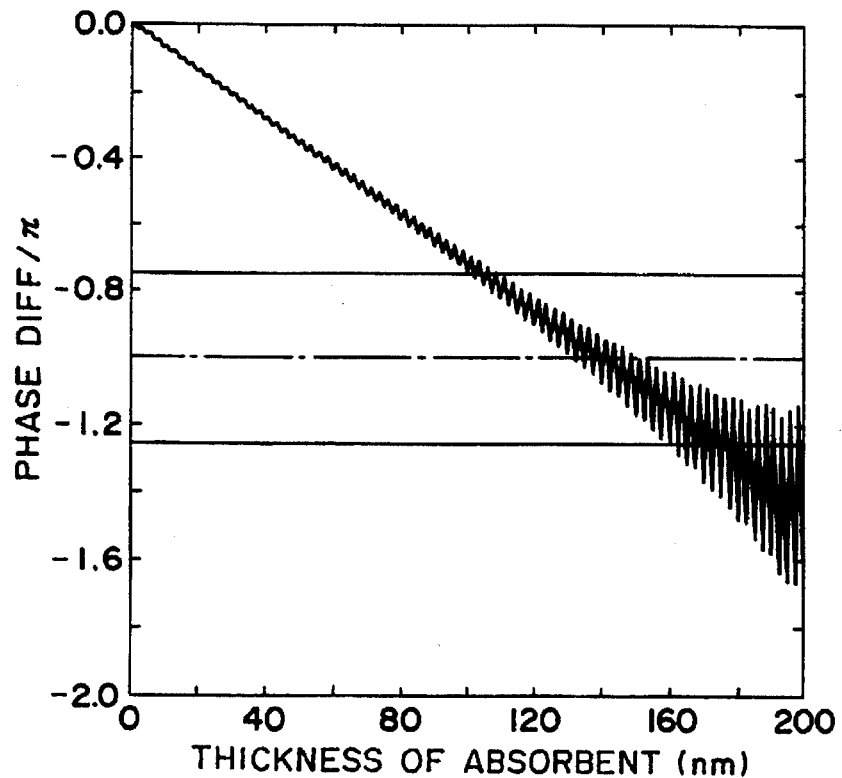
F I G. 15B

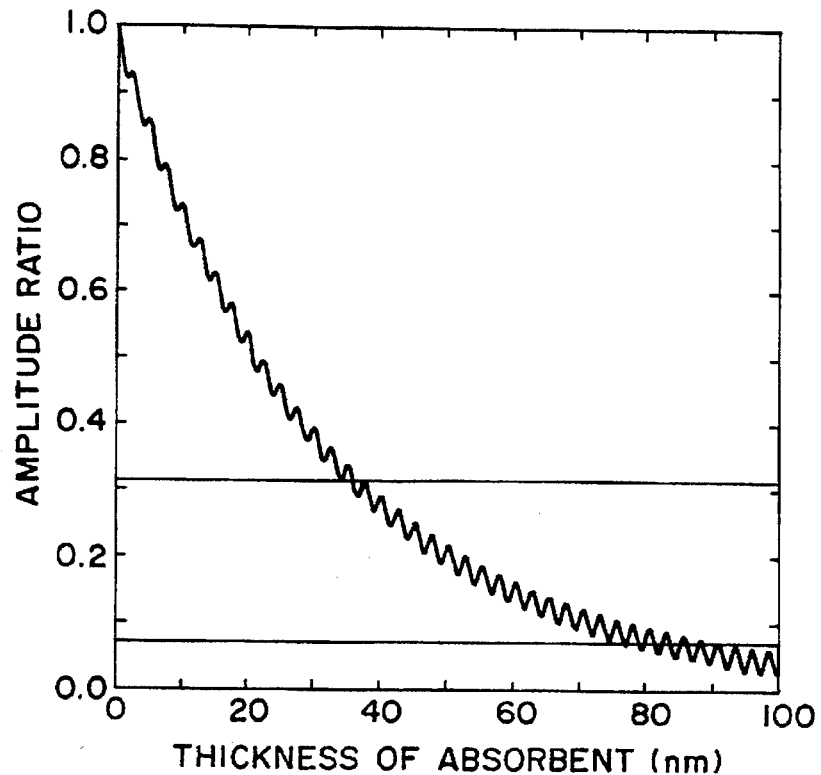
F I G. 16A
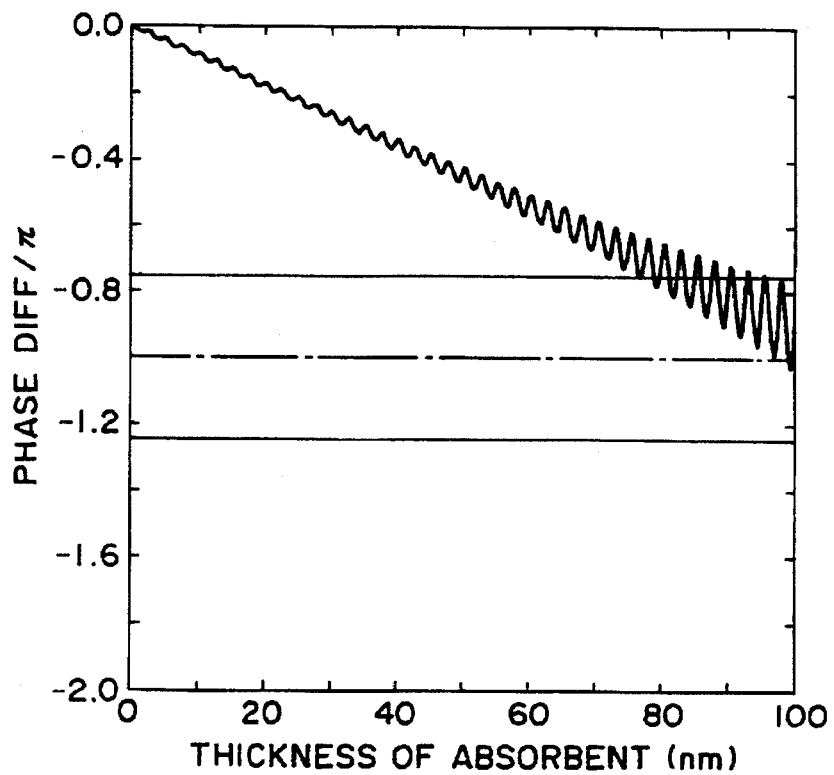
F I G. 16B

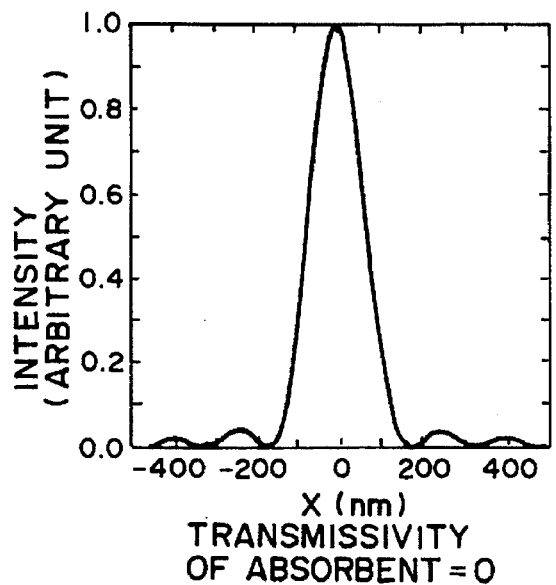
F I G. 17A
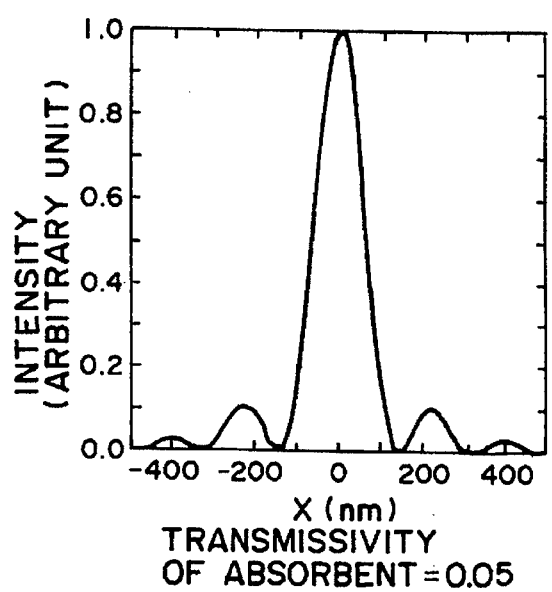
F I G. 17B
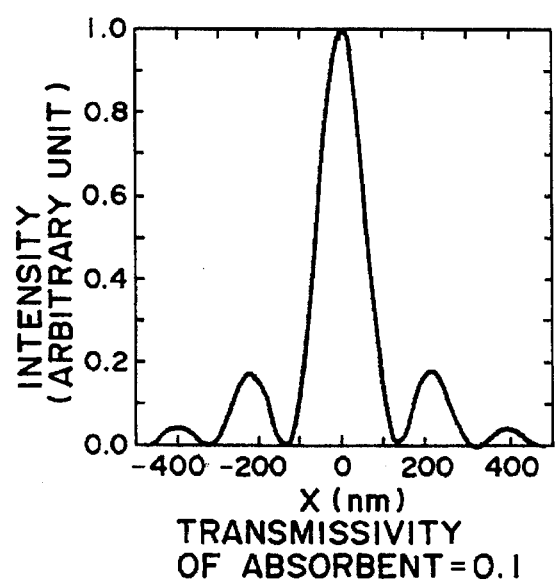
F I G. 17C
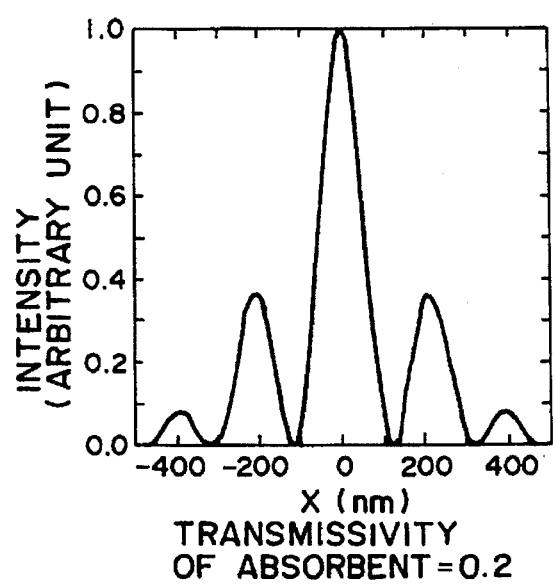
F I G. 17D

LITHOGRAPHIC MASK AND EXPOSURE APPARATUS USING THE SAME

This application is a continuation of application Ser. No. 08/322,166 filed Oct. 13, 1994.

FIELD OF THE INVENTION AND RELATED ART

This invention relates generally to a lithographic mask and, more particularly, to a reflection type mask having a pattern (original) and for reflecting soft X-rays or vacuum ultraviolet rays to project the pattern onto a resist in a reduced scale. In another aspect, the invention is concerned with a reduction projection exposure apparatus using such reflection type mask.

In lithographic processes for optically exposing and transferring a fine structure onto a resist for manufacture of a semiconductor device, further increase in the degree of integration of the semiconductor device and further miniaturization of the same have resulted in a demand for further improvement of resolution. In order to meet this objective, use of shorter wavelength light, e.g., soft X-rays or vacuum ultraviolet rays, has been proposed. A lithographic exposure apparatus using such soft X-rays or vacuum ultraviolet rays may use a reflection type mask having a pattern formed thereon. Soft X-rays or vacuum ultraviolet rays from a light source such as a synchrotron or a laser plasma may be projected on the reflection type mask, and the soft X-rays or vacuum ultraviolet rays reflected by the mask may be projected by a plurality of mirrors upon a resist in a reduced scale. Generally, such reflection type mask comprises a reflection mirror on which an absorbent or an anti-reflection film is provided patterningly. The reflection mirror may comprise a multilayered film comprising alternate layers of different materials.

A reflection type mask may use "phase shift method" such as follows: Namely, if in a reflection type mask there is a phase difference $\pi$ of X-rays reflected by adjacent patterns and when the soft X-rays or vacuum ultraviolet rays reflected by this mask is projected by reflection mirrors upon a resist in a reduced scale, between these patterns and due to interference the X-ray intensity becomes zero, resulting in enhanced contrast. Also, even if the numerical aperture (NA) of the imaging optical system is enlarged, the effect of decrease in contrast of the transferred pattern due to diffraction can be reduced. Thus, the depth of focus can be enlarged. For these reasons, the effect of wafer alignment error or wafer warp is reduced, and decrease of contrast of the transferred pattern can be prevented.

Japanese Laid-Open Patent Application, Laid-Open No. 118914/1992, discloses an example of phase shift reflection type mask wherein a mask substrate is provided with a stepped portion and wherein a multilayered film is formed on the substrate surface. FIG. 20 shows such a reflection type mask. Stepped pattern 103 is formed on a mask substrate 101, and then a multilayered film 104 which defines a reflecting portion is formed to cover the whole surface of the mask substrate 104. On the stepped portion of the multilayered film 104 defined due to the presence of the stepped pattern 103, absorbents 105 are provided. The height of the stepped portion may be properly determined so that the optical path difference to be produced due to the presence of this stepped portion corresponds to a desired phase difference.

U.S. Pat. No. 4,890,309 shows an X-ray transmission type mask utilizing the phase shift method. FIG. 21 shows such a transmission type mask. In this mask, an absorbent pattern 115 is formed on a transmissive film 114. As for the absorbent pattern 115, a material which does not absorb X-rays completely but which is effective to provide an X-ray intensity of about 1/10 as well as a phase change of about $\pi$ is selected. Since the absorbent is adapted to transmit X-ray to some extent and also to provide an inverted phase, the effect of diffraction is reduced and the resolution is enhanced. This type of mask, namely, a phase shift mask having an absorbent effective to transmit (reflect) X-rays to some extent, is called a "half tone type mask".

In the case of a reflection type mask, generally soft X-rays or vacuum ultraviolet rays are projected on a reflective surface with a certain incidence angle. Thus, depending on the height or level of the absorbing material, a shadow may be produced at the reflecting portion. Japanese Laid-Open Patent Application, Laid-Open No. 175736/1989 proposes a solution to such a problem, namely, using an absorbing material of multilayered structure to reduce the thickness of the absorbent pattern.

The reflection type phase shift masks other than of the half tone type need to have a reflective portion, a reflective portion of inverted phase and a non-reflective portion. Thus, complicated mask manufacturing process are required. In the transmission type masks, on the other hand, the transmissivity of the transmission film is low with respect to the wavelength used in the X-ray reduction projection exposure process. Thus, it causes decreased throughput. Also, since the exposure process is usually executed in vacuum ambience, cooling of the transmission film is difficult to accomplish, thus causing thermal deformation and resultant deterioration of the transfer precision.

In the reflection type mask, the illumination light can not be projected perpendicularly onto the mask unless a half mirror is used. Thus, as described above, a shadow may be produced at the reflecting portion, depending on the height of the absorbent material, which leads to a problem in the precision of linewidth to be transferred to the resist. Actually, with respect to the wavelength used in the X-ray reduction projection exposure process, the transmissivity and reflectivity of such a half mirror are not high, and decrease of throughput can not be avoided. Thus, use of a half mirror is not preferable. The problem of a shadow at the reflecting portion is not experienced in the transmission type mask since in the latter the illumination light can be projected on the mask perpendicularly.

In summary, practically the reduction projection exposure process based on soft X-rays or vacuum ultraviolet rays may use a half tone type reflection mask. It is to be noted here that in the region of soft X-rays or vacuum ultraviolet rays there is no established measurement method for measuring the phase of light from the reflection type mask while the intensity of light can be measured relatively easily. Thus, it is difficult to determine the optimum thickness of the absorbing material on the basis of measurement of the intensity and of the phase.

SUMMARY OF THE INVENTION

It is an object of the present invention to provide a half tone type reflection mask wherein the height of an absorbent material is kept sufficiently low so as to sufficiently reduce a shadow which might be produced at a reflecting portion, and wherein an appropriate material suited for such absorbent material as well as the thickness of the same are determined specifically to facilitate the manufacture of the mask.

It is another object of the present invention to provide a reduction projection type exposure apparatus which uses a reflection type mask such as above.

In accordance with an aspect of the present invention, there is provided a lithographic reflection type mask having a pattern (original) and for reflecting soft X-rays or vacuum ultraviolet rays from a light source to project the pattern onto an object to be exposed, wherein the pattern comprises an absorbent pattern provided on a reflecting portion for reflecting the soft X-rays or vacuum ultraviolet rays, and wherein, when the wavelength of the soft X-rays or vacuum ultraviolet rays is denoted by $\lambda$ and the optical constant of the material constituting the absorbing material is denoted by $1-\delta-ik$ ($\delta$ and k are real numbers while i is an imaginary number), the relation $0.29 < k/|\delta| < 1.12$ is satisfied and also the thickness d of the absorbing material satisfies the relation $3\lambda/(16|\delta|) < d < 5\lambda/(16|\delta|)$.

In accordance with another aspect of the present invention, there is provided a reduction projection exposure apparatus which comprises a light source for producing soft X-rays or vacuum ultraviolet rays, a reflection type mask having a pattern as an original, an illumination optical system for projecting the soft X-rays or vacuum ultraviolet rays from said light source to the reflection type mask, an imaging optical system having a reflection mirror for projecting in a reduced scale the soft X-rays or vacuum ultraviolet rays, reflected by the reflection type mask, to a wafer coated with a resist, and an alignment optical system for aligning the reflection type mask and the wafer with each other, wherein the pattern comprises an absorbent pattern provided on a reflecting portion for reflecting the soft X-rays or vacuum ultraviolet rays, and wherein, when the wavelength of the soft X-rays or vacuum ultraviolet rays is denoted by $\lambda$ and the optical constant of the material constituting the absorbing material is denoted by $1-\delta-ik$ ($\delta$ and k are real numbers while i is an imaginary number), the relation $0.29 < k/|\delta| < 1.12$ is satisfied and also the thickness d of the absorbing material satisfies the relation $3\delta/(16|\delta|) < d < 5\lambda/(16|\delta|)$.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIG. 3 is a schematic view for explaining the operation of a half tone type reflection mask according to an embodiment of the present invention.

FIG. 4 is a graph showing the relationship between the transmissivity of an absorbent and the intensity of imaged pattern.

FIG. 7A is a graph showing changes in ratio of amplitude between the light transmitted through an absorbent and then reflected and the light directly reflected, with respect to the changing thickness of the absorbent, in a case where the used wavelength is 13 nm and the absorbent comprises Cr and is provided on Mo/Si multilayered film.

FIG. 7B is a graph similar to FIG. 7A, but showing changes in phase difference between the light transmitted through the absorbent and then reflected and the light directly reflected.

FIG. 15A is a graph showing changes in ratio of amplitude between the light transmitted through an absorbent and then reflected and the light directly reflected, with respect to the changing thickness of the absorbent, in a case where the used wavelength is 5 nm and the absorbent comprises Pt-Ru alloy and is provided on Cr/C multilayered film.

FIG. 15B is a graph similar to FIG. 15A, but showing changes in phase difference between the light transmitted through the absorbent and then reflected and the light directly reflected.

FIG. 16A is a graph showing changes in ratio of amplitude between the light transmitted through an absorbent and then reflected and the light directly reflected, with respect to the changing thickness of the absorbent, in a case where the used wavelength is 5 nm and the absorbent comprises Ta and is provided on Cr/C multilayered film.

FIG. 16B is a graph similar to FIG. 16A, but showing changes in phase difference between the light transmitted through the absorbent and then reflected and the light directly reflected.

FIGS. 17A–17D are graphs each showing an intensity distribution of imaged pattern, wherein FIGS. 17A–17D correspond to cases of absorbent material transmissivities of 0, 0.05, 0.1 and 0.2, respectively.

DESCRIPTION OF THE PREFERRED EMBODIMENTS

Figure 1:
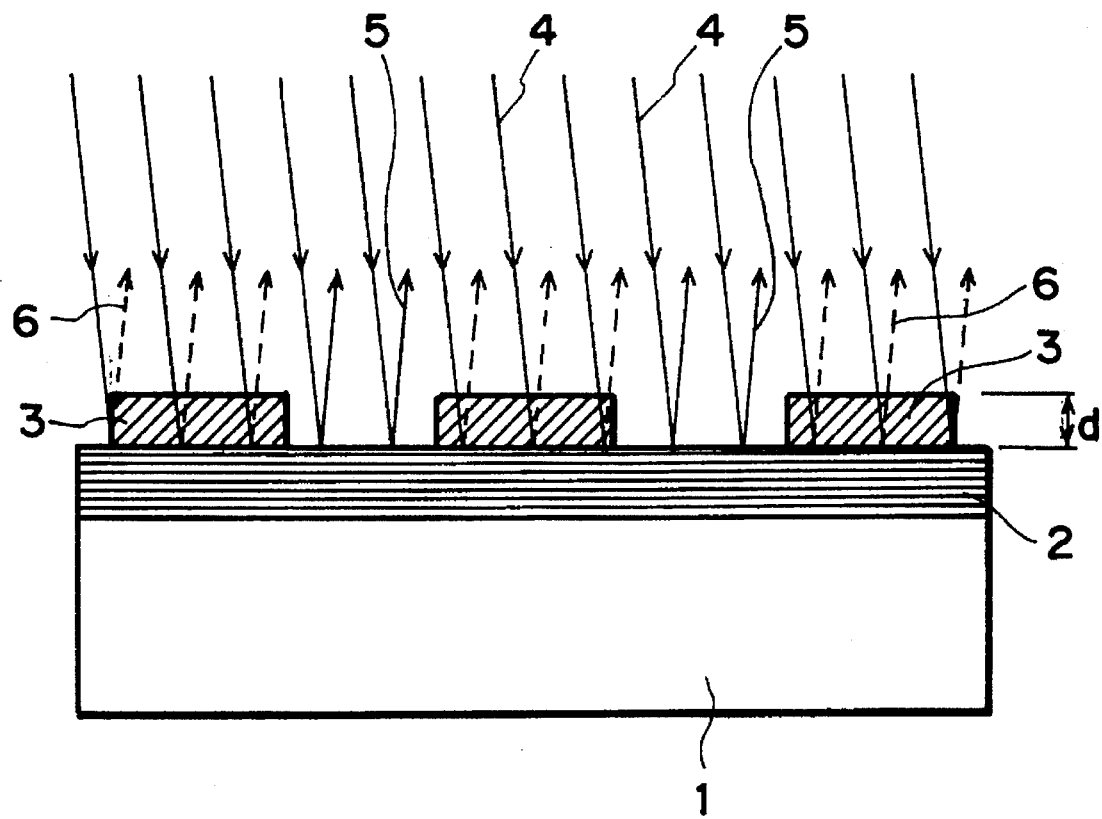
FIG. 1 is a sectional view which illustrates basic structure of a half tone type reflection mask according to an embodiment of the present invention.

With respect to the strength of X-rays passed through the absorbing material, the half tone type mask should satisfy both the condition that the strength is sufficiently low so as not to sensitize the resist and the condition that the strength is high, to some extent, so as to be effective to produce phase inversion in the region adjacent to the region to be exposed, namely, in the region in which the absorbing material is provided, to thereby increase the linewidth precision. If the contrast ratio between a case transmitted through the absorbent material and a case not transmitted through the same is not less than 5, preferably not less than 10, the strength of X-rays passed through the absorbent material is sufficiently low so as not to sensitize the resist. On the other hand, if the amplitude in a case transmitted through the absorbent material is not less than 7% of that in a case not transmitted through the same, the linewidth precision can be improved effectively. The contrast ratio of 5 means that the secondary peak to be produced by diffraction should be ⅕ of the primary peak, but it does not mean that the transmissivity of the absorbent material should be ⅕. FIGS. 17A–17D are graphs showing spatial distributions of X-ray intensity in cases where the transmissivities of absorbent materials are 0, 0.05, 0.1 and 0.2, respectively. By comparing, in these graphs, the primary and secondary peaks of diffraction with each other, it is seen that the contrast ratio becomes equal to 5 when the transmissivity is equal to 0.1 (FIG. 17C). In summary, it is seen that, when the intensity of the soft X-rays of vacuum ultraviolet rays, which are transmitted through the absorbent material and then reflected by the reflection portion underlying the absorbent material and again transmitted through the absorbent material, becomes equal to 0.005 to 0.1 of the soft X-rays or vacuum ultraviolet rays which are directly reflected by the reflecting portion, the mask is most effective as a half tone reflection type mask.

In order to assure this, while taking into account the condition that the phase should be inverted within the absorbent material, if the optical constant of the material constituting the absorbent material is denoted by 1–δ–ik (δ and k are real numbers while i is an imaginary number), most preferably the following relation should be satisfied:

$$4\pi\delta d/\lambda = 1 \qquad (1)$$

However, the relation below is also preferable since it substantially assures phase inversion:

$$¾ < 4\pi\delta d/\lambda < 5/4 \qquad (2)$$

Also, since the intensity ratio should be in the range of 0.005–0.1, the following condition is determined:

$$1.151 < 4\pi k d/\lambda < 2.649 \qquad (3)$$

Finally, as for the ratio of k and δ, the following condition is determined:

$$0.29 < k/\delta < 1.12 \qquad (4)$$

For reduction exposure using soft X-rays or vacuum ultraviolet rays, conditions are set so as to assure the linewidth at the resist side of about 0.1 micron. Generally, in reduction exposure, the reduction ratio is ¼–⅕. Thus, the pattern of a mask has a linewidth of 0.4–0.5 micron. In order to keep the precision of linewidth transferred, in the pattern at the mask side the region of the extent not less than 1/10 of the linewidth should not be shaded by the thickness of the absorbent material. Therefore, the region of not less than 0.02–0.025 should not be shaded. Owing to the disposition of the optical system and the like, the angle of incidence upon the reflection type mask is inclined by about 7–10 deg. from the axis perpendicular to the mask. For these reasons, the thickness of the absorbent material should be not greater than 0.2 micron, and preferably not greater than 0.1 micron. This leads to the situation that, if the wavelength is λ (nm), it follows that k>0.0004λ, preferably k>0.0008λ.

Now, preferred embodiments of the present invention will be explained in conjunction with the drawings. FIG. 1 is a sectional view which illustrates basic structure of a reflection type mask according to an embodiment of the present invention.

This reflection type mask is of half tone type. A reflection film 2 comprising a multilayered film is provided on one side of a substrate 1 to cover the whole surface thereof. Absorbent material pattern 3 having a thickness d is formed on the reflection film 2. The reflection film 2 serves to reflect soft X-rays or vacuum ultraviolet rays, and the materials, the thickness of each layer and the number of layers are determined in accordance with the wavelength to be used. The absorbent pattern 3 is defined in accordance with the pattern to be transferred onto the object to be exposed (e.g., resist) through the reduction exposure process. The material and the thickness d thereof are determined in a manner, to be described later.

When input light 4 comprising soft X-rays or vacuum ultraviolet rays is projected on this reflection type mask, at the portion where the absorbent pattern 3 is absent, the input light 4 is reflected directly such that reflection light 5 emits. It is to be noted that the input light 4 is projected onto the surface of the reflection film 2 along a direction slightly inclined with respect to the direction perpendicular to the reflection film 2 surface. At the portion where the absorbent pattern 3 is present, the input light enters and goes through the absorbent pattern 3 while being attenuated. Subsequently, it is reflected by the reflection film 3 and, then, it is transmitted again through the absorbent pattern 3 while being attenuated. Finally, it emits as reflection light 6 (broken lines). As compared with the reflection light 5, the phase of the reflection light is shifted by about $\pi(3\pi/4-5\pi/4)$, and the intensity of the reflection light 6 is about 0.005–0.1 of that of the reflection light 5.

Figure 2A:
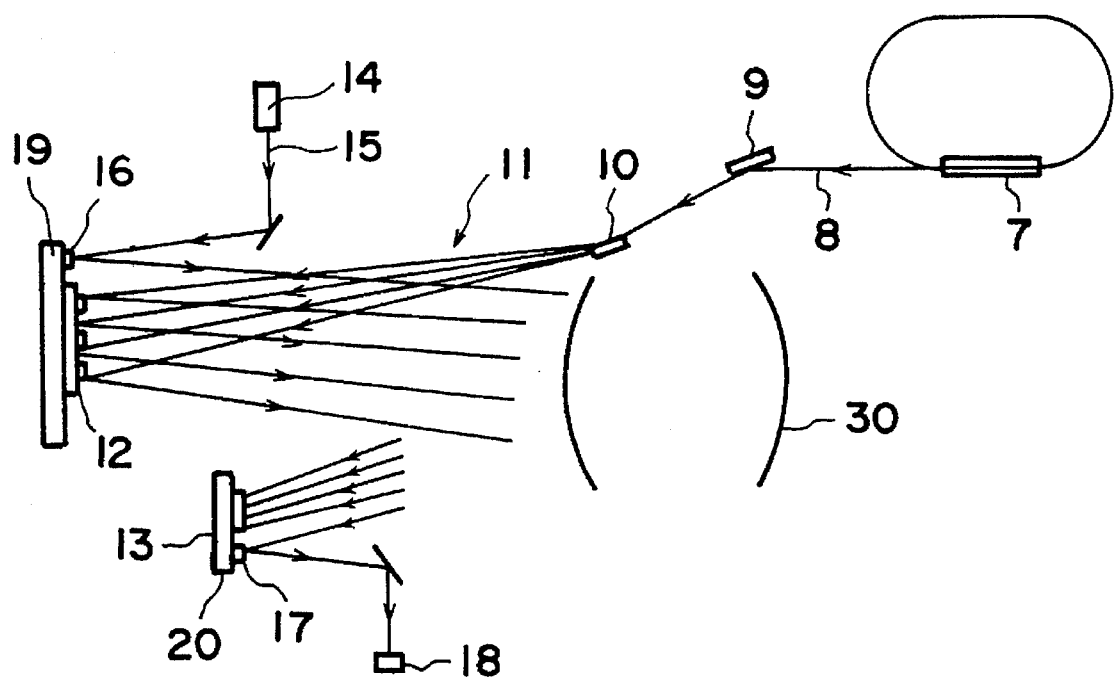
FIG. 2A is a schematic view of a reduction projection exposure apparatus according to an embodiment of the present invention.

Next, an embodiment of a reduction projection exposure apparatus using a half tone reflection type mask described above, will be explained. FIG. 2A is a schematic view of a reduction projection exposure apparatus according to one embodiment of the present invention, and FIG. 2B is a schematic view of an imaging optical system (reduction optical system) of this reduction projection exposure apparatus.

Reflection type mask 12 such as described above is held by a mask stage 19. For projecting soft X-rays or vacuum ultraviolet rays from a light source 7 such as a synchrotron radiation device, for example, to the reflection type mask 12, an illumination optical system including two mirror 8 and 10 is provided. The light emitting from the reflection type mask 12 is projected through an imaging optical system 30 onto a wafer 13. The wafer 13 is held by a wafer stage 20.

Figure 2B:
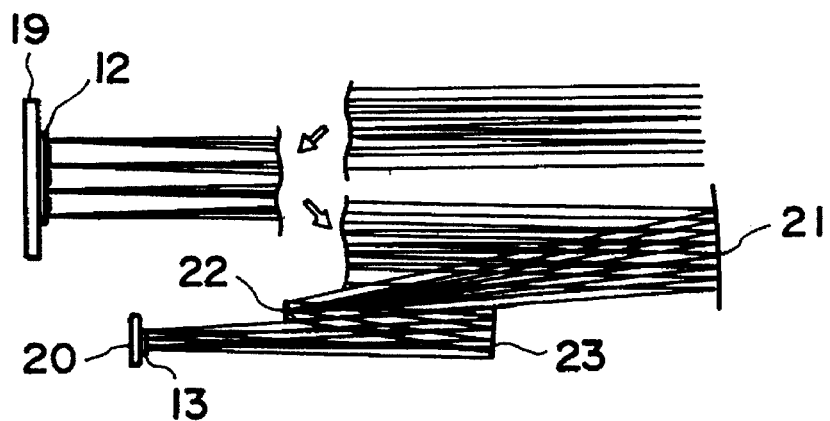
FIG. 2B is a schematic view of a reduction optical system of the exposure apparatus of the FIG. 2A embodiment.

FIG. 2B shows details of the imaging optical system 30. This imaging optical system 30 serves to project an absorbent pattern on the reflection type mask 12 onto the wafer 13 at a reduction ratio of ⅕, for example. It comprises two concave mirror 21 and 23 and one convex mirror 22. In response to impingement of the soft X-rays or vacuum ultraviolet rays upon the reflection type mask 12, the light is influenced in accordance with the absorbent pattern on the reflection type mask 12. Namely, it is directly reflected by the reflecting portion of the reflection type mask 12 or it goes through the absorbent pattern, is reflected by the reflecting portion and is transmitted again through the absorbent material. These lights are then reflected by the mirrors 21, 22 and 23 of the imaging optical system 30 sequentially, by which a desired pattern of the reflection type mask is imaged on the wafer 13 in a reduced scale.

In this reduction projection exposure apparatus, a reference alignment mark 16 is formed on the mask stage 19, and an alignment mark 17 is formed on the wafer stage 20. These marks are used for alignment purpose. Namely, when light 15 from a light source 14 is projected on the reference alignment mark of the mask stage 19, the reflection light therefrom goes through the imaging optical system 30 and it interferes with the alignment mark 17 of the wafer stage 20. The intensity of thus interfered light is detected by a detector 18. On the basis of the result of detection by this detector 18, alignment of the reflection type mask 12 and the wafer 13 is executed. In this case, the light source 14 may be the same light source as the light source 8. Further, both the alignment marks 16 and 17 of the mask stage 19 and the wafer stage 20 may be reflection patterns provided by multilayered films for soft X-rays or vacuum ultraviolet rays. Although not shown in the drawings, alignment optical systems are provided to perform the alignment operation for the alignment mark 17 of the wafer stage 20 and and alignment mark of the wafer 13, and for the alignment mark 16 of the mask stage 19 and an alignment mark of the reflection type mask, respectively.

Referring to FIG. 3, details of the absorbent material pattern of the reflection type mask of the present invention will be explained. Here, a case where the pattern of the reflection type mask is projected on a wafer in a reduction scale of ⅕, will be considered. The width of the absorbent material pattern 3 is 0.5 micron, and also the width of the portion sandwiched between the absorbent material patters 3 (exposed portion of the reflection film 2) is 0.5 micron. The numerical aperture at the image side is 0.08, and the wavelength of light used is 13 nm. The intensity of light transmitted through the absorbent material pattern and then reflected and subsequently transmitted again through the absorbent material pattern 3, is denoted by T. The intensity of light directly reflected by the reflection film 2, without being transmitted through the absorbent material pattern 3, is denoted by I.

FIGS. 17A–17D show light intensity distributions, upon a wafer, in cases where T/I is equal to 0, 0.05, 0.1 and 0.2, respectively. Here, since the exposure process is done with a reduction ratio of ⅕, the linewidth on the wafer is 0.1 micron. Namely, a range of ±0.05 micron from the center should be exposed, and the remaining portion should not be exposed.

Here, the ratio of the intensity at the position of 0.05 micron from the center to the difference in intensity between the ±10% positions (i.e., the position of 0.045 micron and the position of 0.005 micron), that is, the tilt of intensity, is detected. The results are shown in FIG. 4. As seen from FIG. 4, a higher transmissivity of the absorbent material is preferable in the point of tolerance to the intensity change. In order to assure this effect, namely, in order to obtain the effect of not lower than 10%, the transmissivity of the absorbent material should preferably be not less than 0.005. On the other hand, if the peak at the center of the intensity distribution is called "primary peak" while the peaks at opposite sides thereof are called "secondary peaks", as clearly seen from FIGS. 17A–17D, the intensity ratio between the primary and secondary peaks becomes equal to ⅓ as the transmissivity of the absorbent material is 0.1. Also, the ratio become equal to ⅔ when the transmissivity of the absorbent material is 0.2. Thus, in consideration of the condition that the contrast ratio should be not lower than 5, the transmissivity of the absorbent material should preferably be not greater than 0.1. Since the contrast ratio should more preferably be not lower than 10, the transmissivity of the absorbent material should more preferably be not greater than 0.05. In summary, when the transmissivity of the absorbent material is within the range of 0.005–0.1, the mask serves as a most effective half tone reflection type mask.

Figure 5:
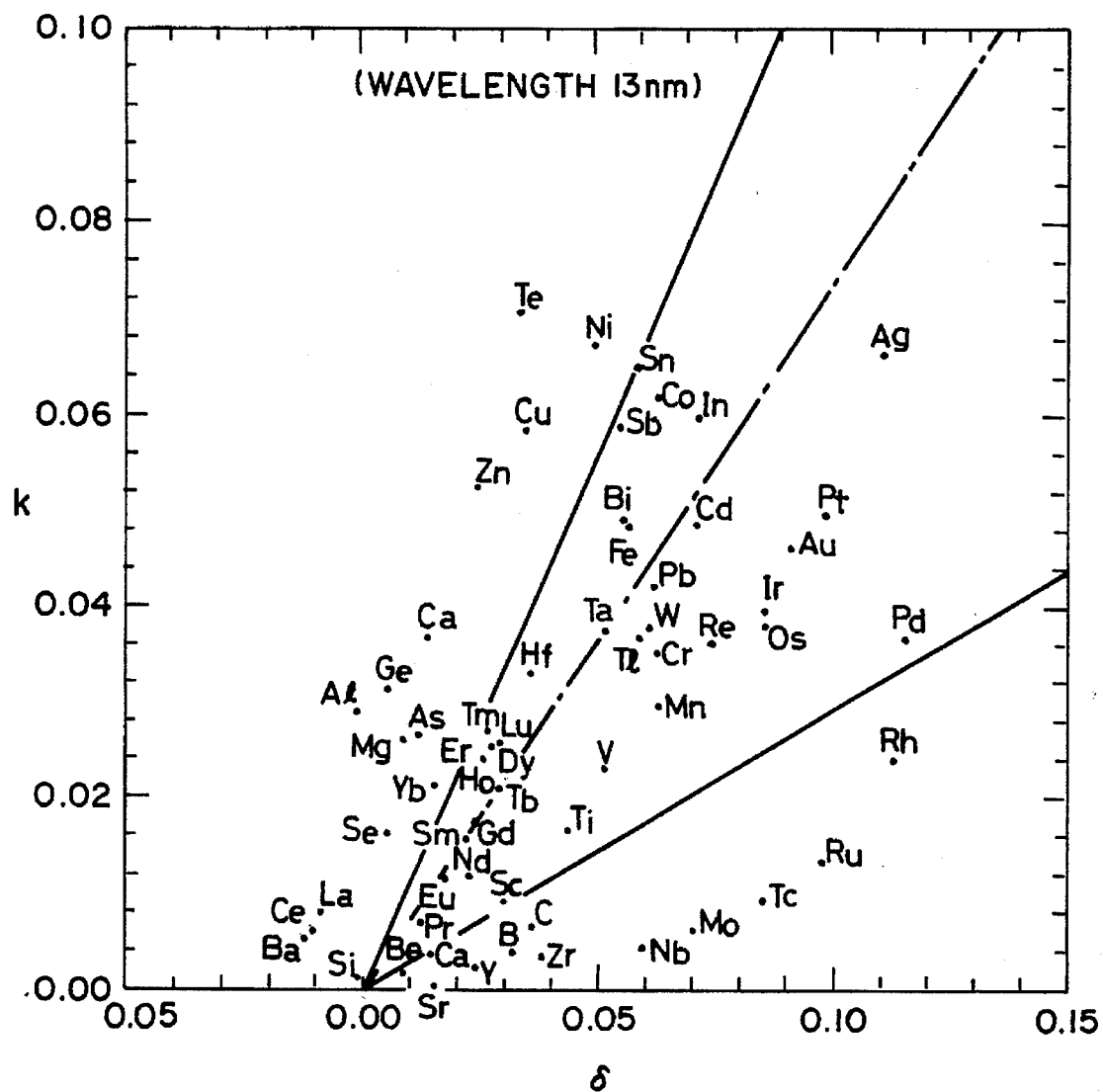
FIG. 5 is a graph showing optical constants of various materials with respect to light of a wavelength of 13 nm.

FIG. 5 shows δ and k of various elements (simple) with respect to light of wavelength of 13 nm. Dash-and-dot line represents the most preferable relation between δ and k, and the substances near this are most suitable materials as the absorbent material of the half tone type mask. Two solid lines defines a range: those materials included in this range are suitable as the absorbent material of the half tone mask. It is seen from FIG. 5 that, in the case of wavelength of 13 nm, the absorbent material pattern of the mask may preferably be formed by using V, Cr, Mn, Fe, Co, Ag, Cd, In, Sn, Sb, lanthanoids, Hf, Ta, W, Re, Os, Ir, Pt, Au, T1, Pb or Bi, singly, or by using a composite or alloy including any one of them.

The substances outside the two solid lines in FIG. 5 are not preferable as the absorbent material of the mask if each is used singly. However, in a case of a composite or alloy which contains at least one element of the element group of B, C, Ti, Zr, Mo, Ru, Rh and Pd and which also contains at least one element of the element group of Ca, Mg, Al, Ni, Cu, Zn, Ga, Ge, As, Se and Te, the relation is that $\delta$ and $k$ thereof are included within the range between the two solid lines. Thus, such material may preferably be used as the absorbent material of the reflection type mask. For example, in an alloy of Mo and Ni (atom ratio of 1:1), $\delta=0.061$ and $k=0.031$. Thus, it may preferably be used in a half tone type mask.

As regards the thickness d of the absorbent material pattern, if the relation $$d=\lambda/(4|\delta|)$$

is satisfied, it results in that the phase of soft X-rays or vacuum ultraviolet rays, transmitted through the absorbent material and reflected by the reflection film underlying it and further being transmitted through the absorbent material, differs by $\pi$ from the phase of the soft X-rays or vacuum ultraviolet rays directly reflected by the reflection film.

If the thickness is in the range:

$$3\lambda/(16|\delta|)<d<5\lambda/(16|\delta|)$$

the phase changes by about $\pi$, and it serves well as a phase shift type mask and contributes to improvement of imaging performance.

Figure 6A:
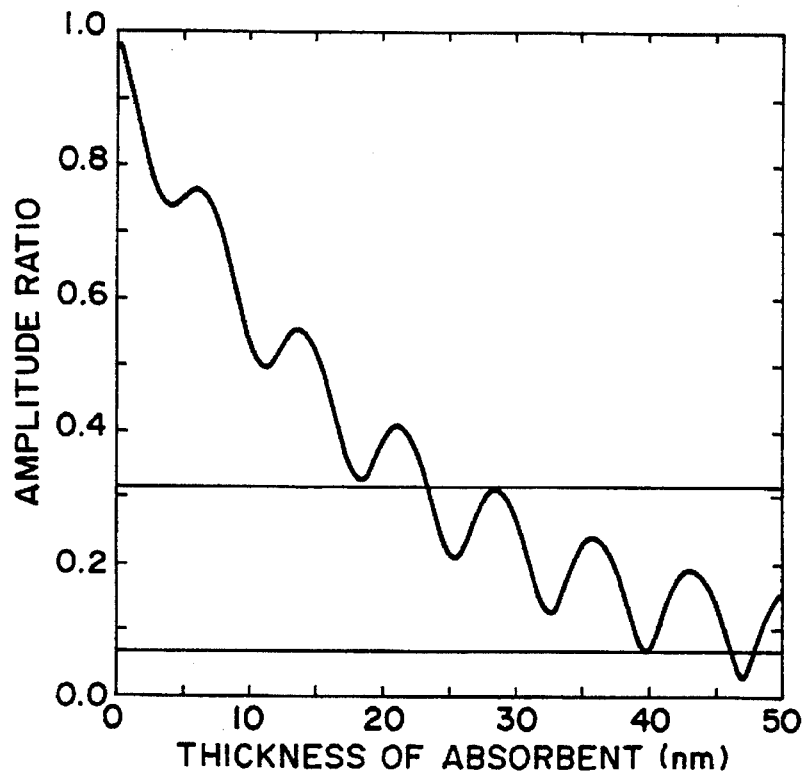
FIG. 6A is a graph showing changes in ratio of amplitude between the light transmitted through an absorbent and then reflected and the light directly reflected, with respect to the changing thickness of the absorbent, in a case where the used wavelength is 13 nm and the absorbent comprises Pt and is provided on Mo/Si multilayered film.
Figure 6B:
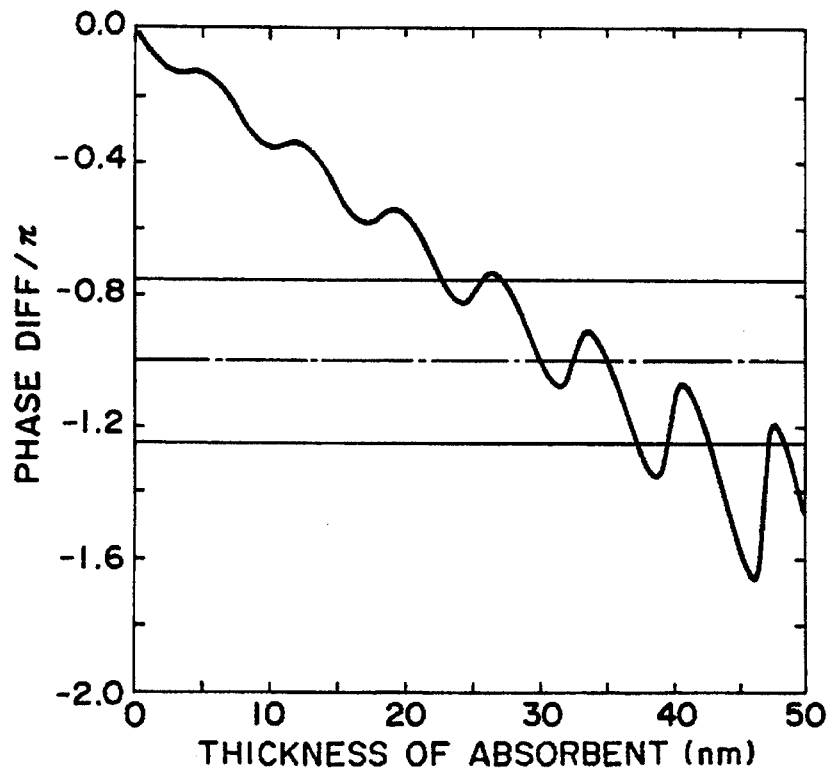
FIG. 6B is a graph similar to FIG. 6A, but showing changes in phase difference between the light transmitted through the absorbent and then reflected and the light directly reflected.

FIG. 6A shows changes, with the absorbent material thickness, in amplitude ratio between the light transmitted and reflected by the absorbent material and the directly reflected light in an occasion where a reflection film comprises a multilayered film of forty-one layers of Mo and Si, having a film period of 6.7 nm and where a Pt layer is accumulated on this reflection film as an absorbent material. FIG. 6B shows changes, with the absorbent material thickness, in the phase difference/$\pi$ between the light transmitted and reflected by the absorbent material and the directly reflected light in the case of FIG. 6A. Here, the light transmitted and reflected by the absorbent material is the soft X-rays or vacuum ultraviolet rays which are transmitted through the absorbent material, then reflected by the reflection film underlying the absorbent material and then transmitted again through the absorbent material. On the other hand, the directly reflected light is the soft X-rays or vacuum ultraviolet rays directly reflected by the reflection film without being transmitted through the absorbent material. The square of the ratio of amplitude corresponds to the ratio of intensity, and thus to the transmissivity of the absorbent material as described. The data shown in FIGS. 6A and 6B as well as the data shown in FIGS. 7A, 7B, 8A, 8B, 9A, 9B, 10A, 10B, 11A, 11B, 13A, 13B, 14A, 14B, 15A, 15B, 16A and 16B are those calculated in accordance with the table suggested in the paper "Low-Energy X-ray Interaction Coefficients: Photoabsorption, Scattering and Reflection" by B. L. Henke, E. M. Gullikson and J. C. Davis. The table is shown in "Atomic Data and Nuclear Data Tables", Vol. 27, No. 1(1982), B. L. Henke, P. Lee, T. J. Tanaka, R. L. Shimabukuro and B. K. Fujikawa.

As seen in FIG. 5, Pt has an optical constant suitable as an absorbent material. In FIGS. 6A and 6B, two solid line are illustrated. These solid lines represent the upper and lower limits, respectively, of the desirable range of amplitude ratio, i.e., the desirable range of phase difference/$\pi$, under the conditions described above. Thus, the absorbent material thickness included, in both of FIGS. 6A and 6B, in the range defined by the two solid lines, is preferable as the thickness of the absorbent material of a half tone reflection type mask. As clearly seen from the drawings, as the Pt layer thickness is near 30 nm, in both of the graphs, the value is included in the range between the two solid lines. Thus, it is seen that, by forming an absorbent material by using a Pt layer of 30 nm, a half tone reflection type mask being preferable with respect to the wavelength 13 nm is obtainable.

Figure 8A:
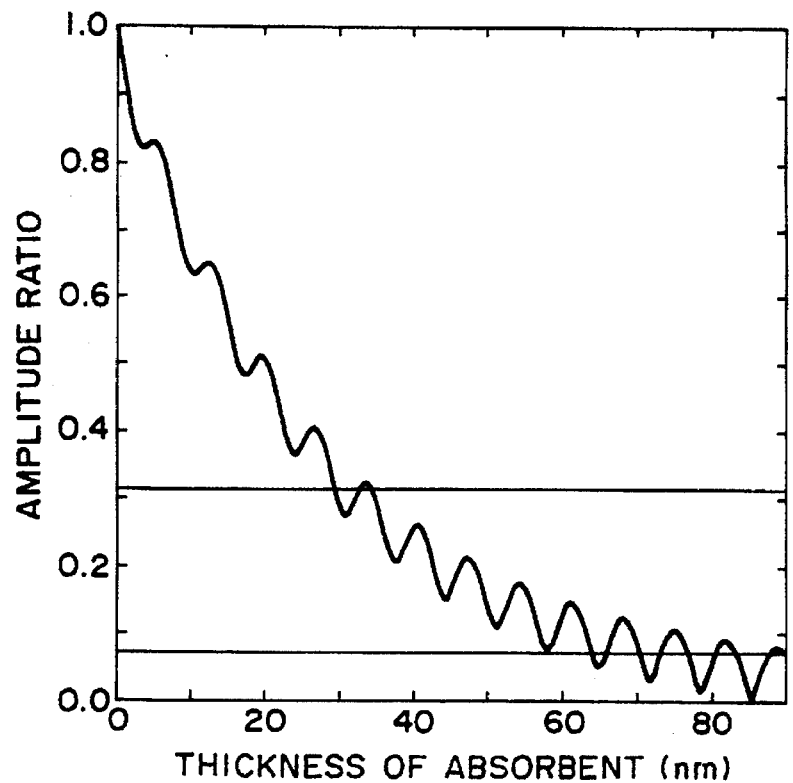
FIG. 8A is a graph showing changes in ratio of amplitude between the light transmitted through an absorbent and then reflected and the light directly reflected, with respect to the changing thickness of the absorbent, in a case where the used wavelength is 13 nm and the absorbent comprises Ta and is provided on Mo/Si multilayered film.
Figure 8B:
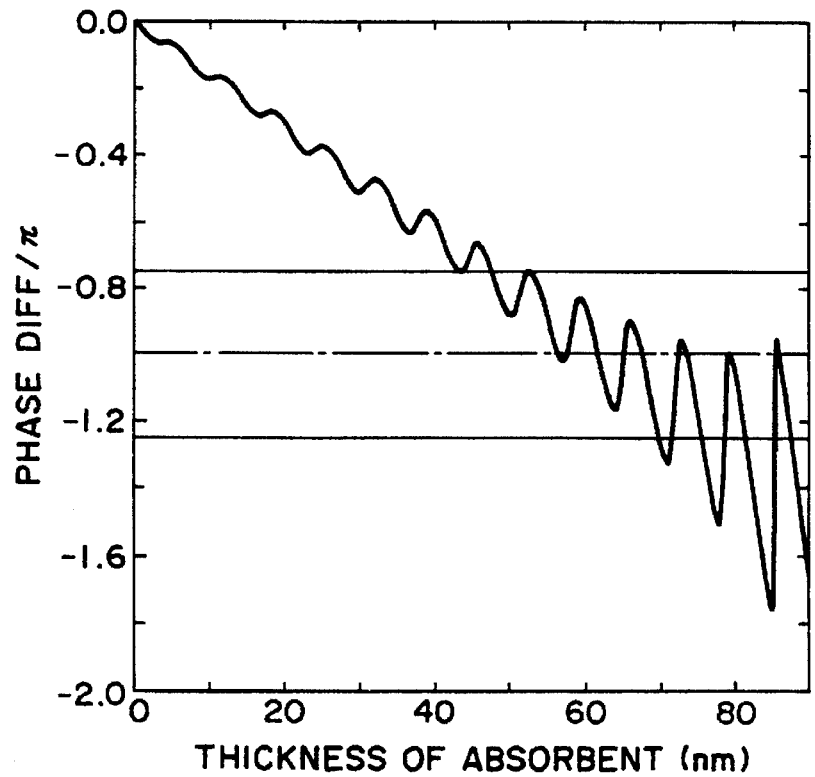
FIG. 8B is a graph similar to FIG. 8A, but showing changes in phase difference between the light transmitted through the absorbent and then reflected and the light directly reflected.
Figure 9A:
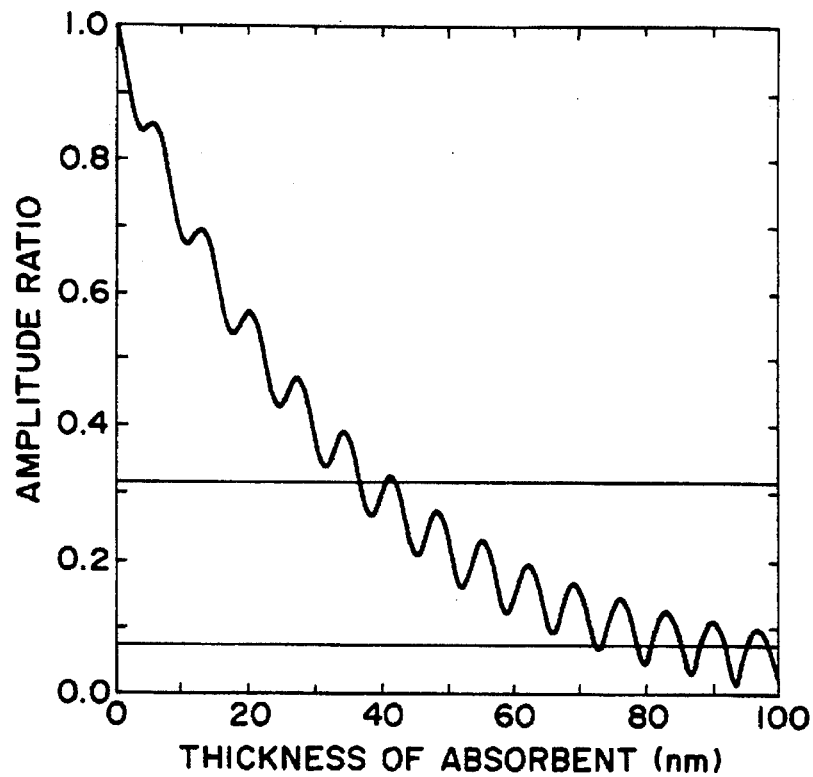
FIG. 9A is a graph showing changes in ratio of amplitude between the light transmitted through an absorbent and then reflected and the light directly reflected, with respect to the changing thickness of the absorbent, in a case where the used wavelength is 13 nm and the absorbent comprises Mo-Ni alloy and is provided on Mo/Si multilayered film.
Figure 9B:
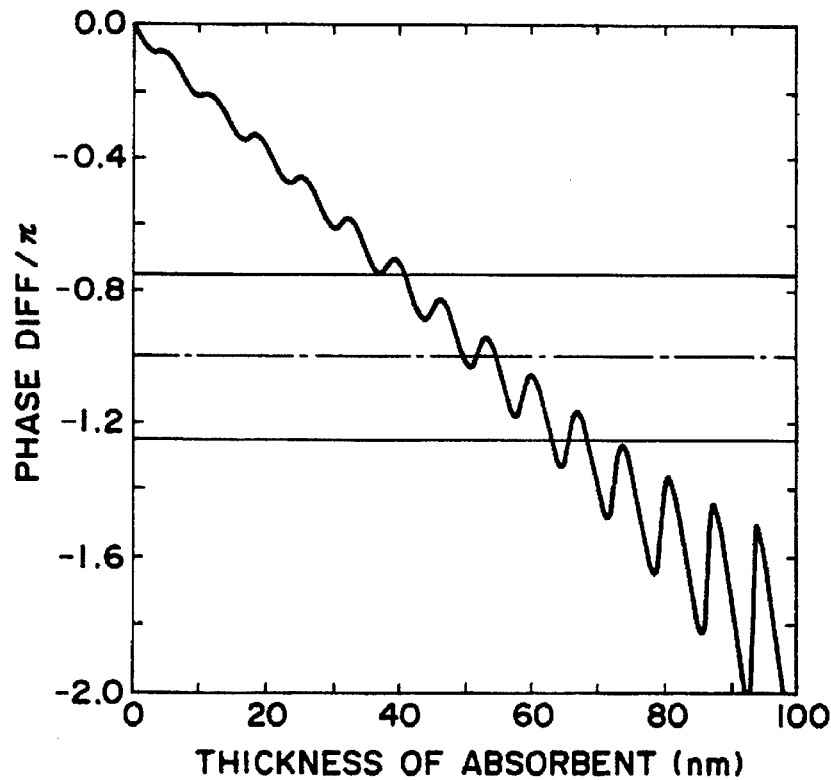
FIG. 9B is a graph similar to FIG. 9A, but showing changes in phase difference between the light transmitted through the absorbent and then reflected and the light directly reflected.

FIGS. 7A and 7B show the absorbent material thickness dependency of the amplitude ratio and the phase difference/$\pi$, respectively, in an occasion where a Cr layer is provided as an absorbent material upon a reflection film comprising a Mo/Si multilayer. FIGS. 8A and 8B are graphs similar to FIGS. 7A and 7B, in an occasion where a Ta layer is used as an absorbent material. FIGS. 9A and 9B are similar graphs in an occasion where an alloy layer of Mo and Ni is used as an absorbent material. As described, the material Cr or Ta singly or the Mo-Ni alloy has an optical constant preferable as an absorbent material. It is seen from these drawings that a preferable absorbent material pattern for a half tone type mask to be used with light of wavelength 13 nm is attainable with a thickness near 50 nm in the case of Cr, with a thickness near 60 nm in the case of Ta, or with a thickness near 50 nm in the case of Mo-Ni alloy.

Figure 10A:
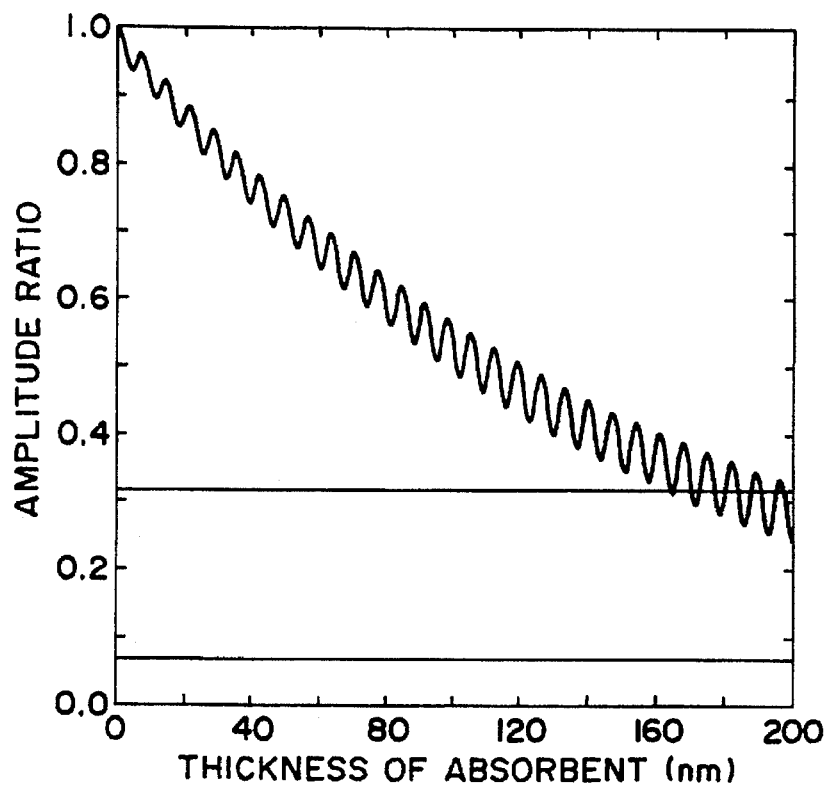
FIG. 10A is a graph showing changes in ratio of amplitude between the light transmitted through an absorbent and then reflected and the light directly reflected, with respect to the changing thickness of the absorbent, in a case where the used wavelength is 13 nm and the absorbent comprises Mo and is provided on Mo/Si multilayered film.
Figure 10B:
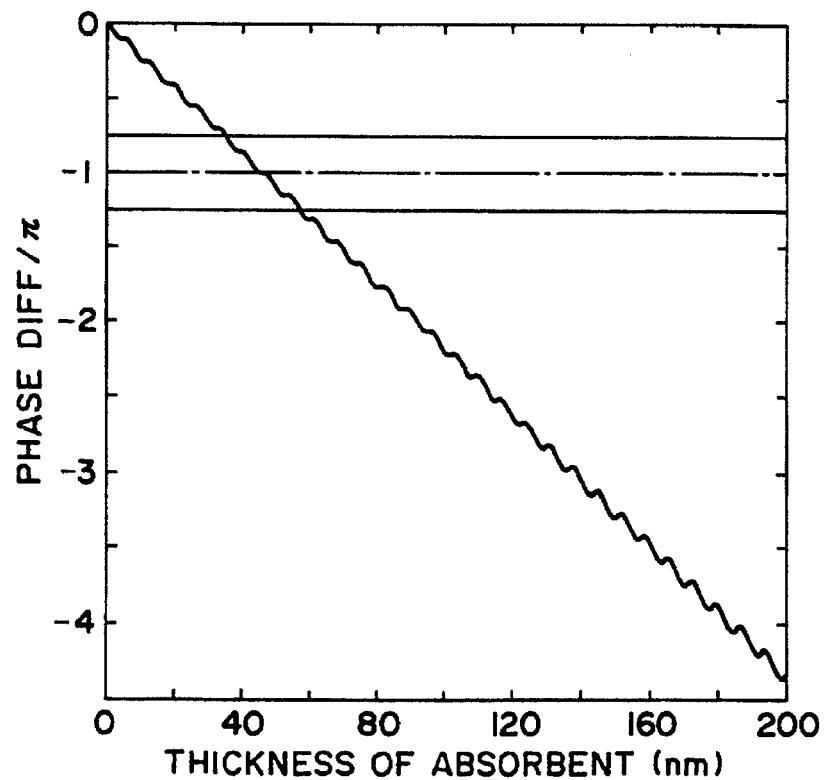
FIG. 10B is a graph similar to FIG. 10A, but showing changes in phase difference between the light transmitted through the absorbent and then reflected and the light directly reflected.

FIGS. 10A and 10B are graphs showing amplitude ratio and the phase difference/$\pi$ in an occasion where a Mo layer is provided as an absorbent material upon a reflection film of Mo/Si multilayer. As described, Mo single element is not suitable for an absorbent material of a half tone reflection type mask. In FIG. 10A, a suitable amplitude ratio is provided with a thickness not less than 200 nm. However, with such thickness, the phase difference/$\pi$ goes beyond ±1. Thus, its unsuitability for an absorbent material is actually seen in the drawing. In principle, the phase difference/$\pi$ should not necessarily be in the vicinity of ±1, and improved image performance may be attained with an odd number other than ±1. However, if the phase difference/$\pi$ is an odd number other than ±1, a small change in film thickness can undesirably cause a large change in the phase difference/$\pi$. In the case of Mo described above, it is only in the occasion where the thickness of the absorbent material is not less than 200 nm that the amplitude ratio is appropriate and the phase difference/$\pi$ is an odd number (−5). This is not preferable also in the point of the magnitude of the shadow produced at the reflecting portion.

Figure 11A:
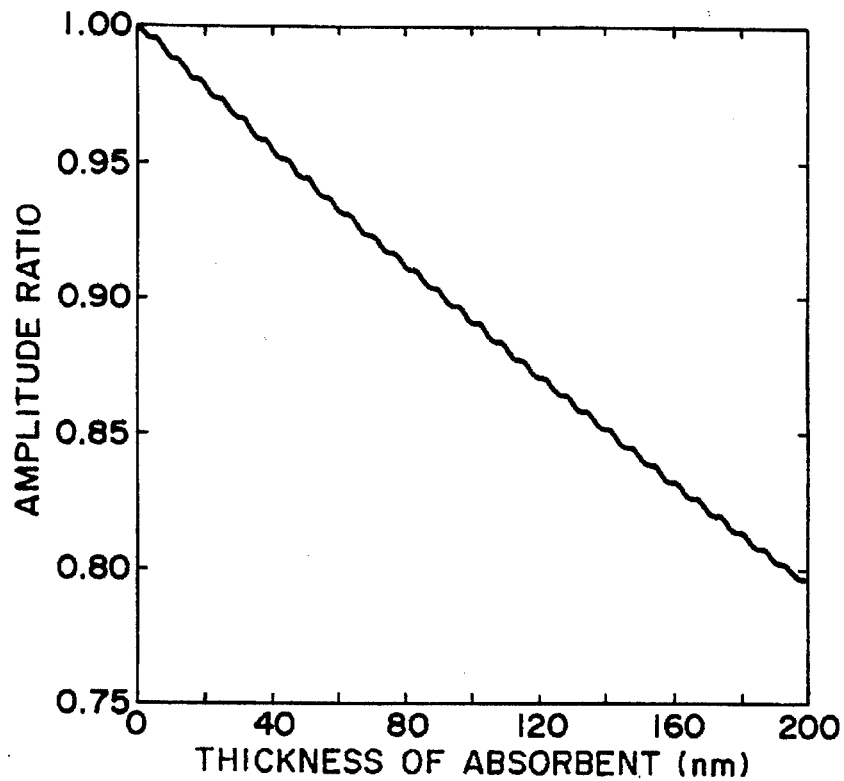
FIG. 11A is a graph showing changes in ratio of amplitude between the light transmitted through an absorbent and then reflected and the light directly reflected, with respect to the changing thickness of the absorbent, in a case where the used wavelength is 13 nm and the absorbent comprises Si and is provided on Mo/Si multilayered film.
Figure 11B:
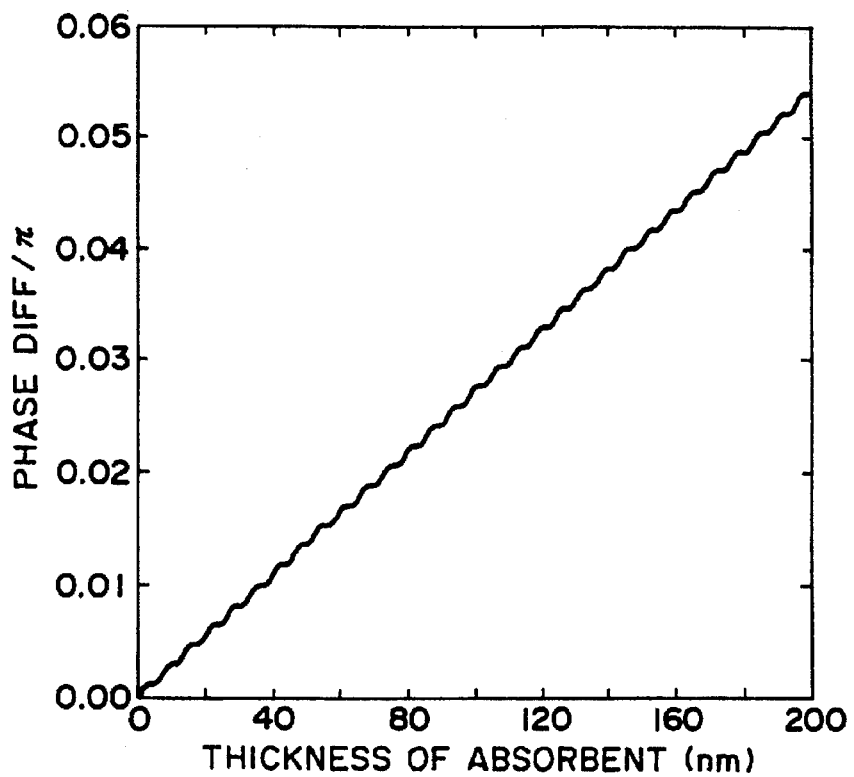
FIG. 11B is a graph similar to FIG. 11A, but showing changes in phase difference between the light transmitted through the absorbent and then reflected and the light directly reflected.

FIGS. 11A and 11B show amplitude ratio and phase difference/$\pi$ in an occasion where a Si layer is provided as an absorbent material upon a reflection film comprising Mo/Si multilayer. As seen from FIG. 8, Si single element is not suitable for an absorbent material of a half tone reflection type mask. Actually, it is seen from FIGS. 11A and 11B that, with a thickness not greater than 200 nm, both the amplitude ratio and the phase difference/$\pi$ take unsuitable values.

While the foregoing description has been made with respect to an example wherein light of a wavelength of 13 nm is used, the invention is applicable to cases using soft X-rays or vacuum ultraviolet rays of any other desired wavelength. As an example, a case where light of a wavelength of 5 nm will be explained below.

Figure 12:
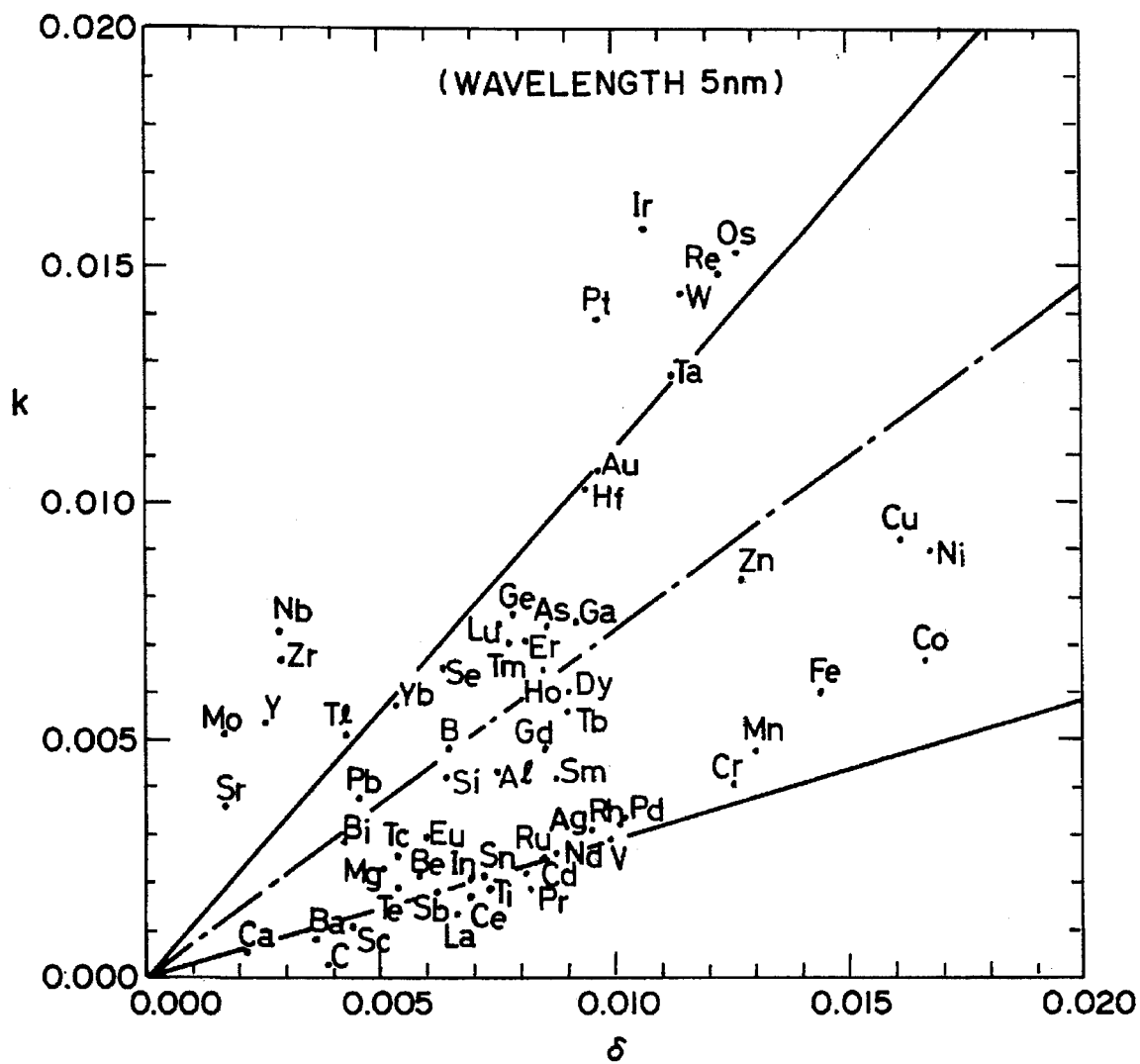
FIG. 12 is a graph showing optical constants of various materials with respect to light of a wavelength of 5 nm.

FIG. 12 shows $\delta$ and $k$ of various elements (single) with respect to light of a wavelength of 5 nm. In the drawing, a dash-and-dot line represents a most preferable relation between δ and k, and those substrates near this line are materials most preferable as an absorbent material of a half tone type mask. Two solid lines defines a range: those materials included in this range are suitable as the absorbent material of the half tone mask. It is seen from FIG. 12 that, in the case of wavelength of 5 nm, the absorbent material pattern of the mask may preferably be formed by using Mg, Al, Si, Cr, Mn, Fe, Ce, Ni, Cu, Zn, Ga, Ge, As, Se, Rh, Pd, Ag, lanthanoids, Hf, Au, Pb or Bi, singly, or by using a composite or alloy including any one of them.

The substances outside the two solid lines in FIG. 12 are not preferable as the absorbent material of the mask if each is used singly. However, in a case of a composite or alloy which contains at least one element of the element group of Ca, Se, Ti, V, Ru, Cd, In, Sn, Sb, Te and Ba and which also contains at least one element of the element group of Y, Zr, Nb, Mo, Ta, W, Re, Os, Ir and Pt, the relation of δ and k is such as within the range between the two solid lines of FIG. 12. Thus, such material may preferably be used as the absorbent material of the reflection type mask. For example, in an alloy of Pt and Ru (atom ratio of 1:1), δ=0.00899 and k=0.00834. Thus, it may preferably be used in a half tone type mask.

Figure 13A:
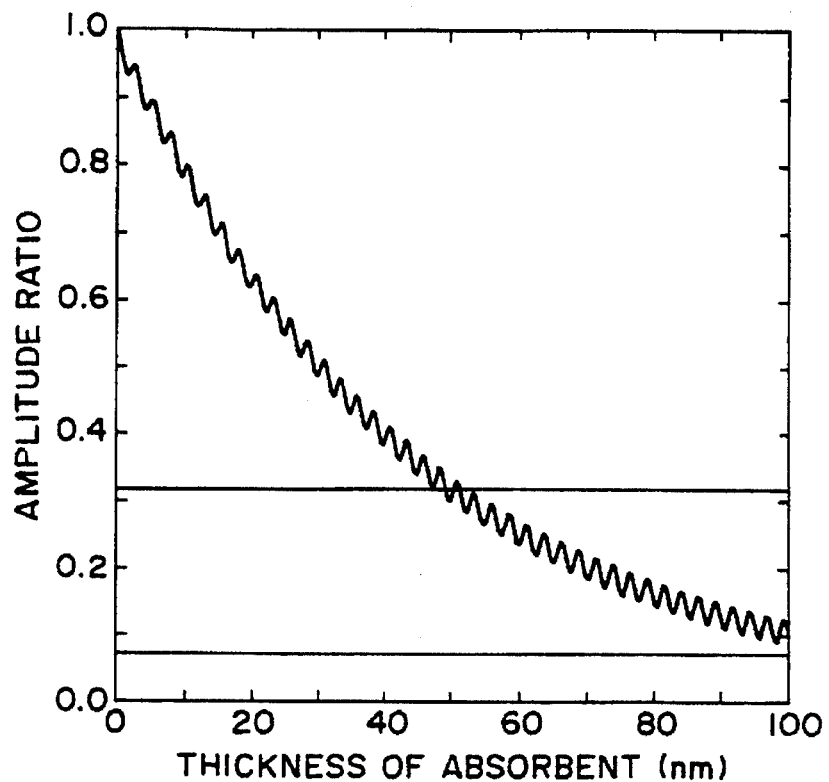
FIG. 13A is a graph showing changes in ratio of amplitude between the light transmitted through an absorbent and then reflected and the light directly reflected, with respect to the changing thickness of the absorbent, in a case where the used wavelength is 5 nm and the absorbent comprises Ni and is provided on Cr/C multilayered film.
Figure 13B:
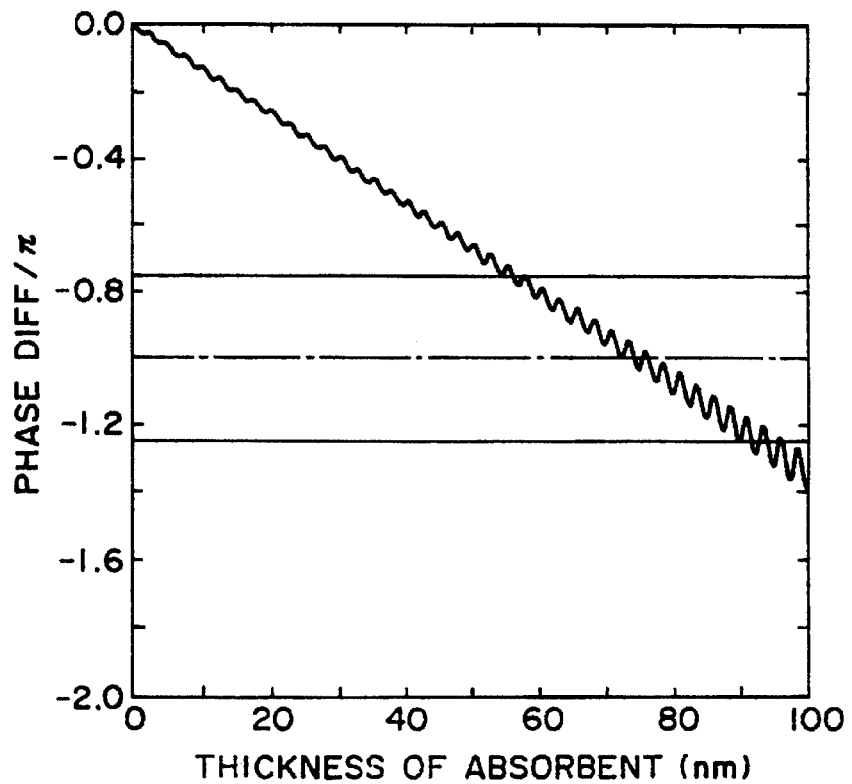
FIG. 13B is a graph similar to FIG. 13A, but showing changes in phase difference between the light transmitted through the absorbent and then reflected and the light directly reflected.

FIG. 13A shows changes, with the absorbent material thickness, in amplitude ratio between the light transmitted and reflected by the absorbent material and the directly reflected light in an occasion where a reflection film comprises a multilayered film of 201 layers of Cr and C, having a film period of 2.5 nm and where a Ni layer is accumulated on this reflection film as an absorbent material. FIG. 13B shows changes, with the absorbent material thickness, in the phase difference/π between the light transmitted and reflected by the absorbent material and the directly reflected light in the case of FIG. 13A. Also in these drawings, as in the case of the wavelength 13 nm, upper and lower limits are illustrated by solid lines with respect to each of the amplitude ratio and the phase difference/π. As described above, Ni has an optical constant suitable as an absorbent material. As seen from FIGS. 13A and 13B, with a thickness near 70 nm, both the amplitude ratio and the phase difference/π take appropriate values. Thus, it is seen that a preferable absorbent material for a half tone type mask to be used with light of a wavelength of 5 nm is obtainable with a thickness of 70 nm.

Figure 14A:
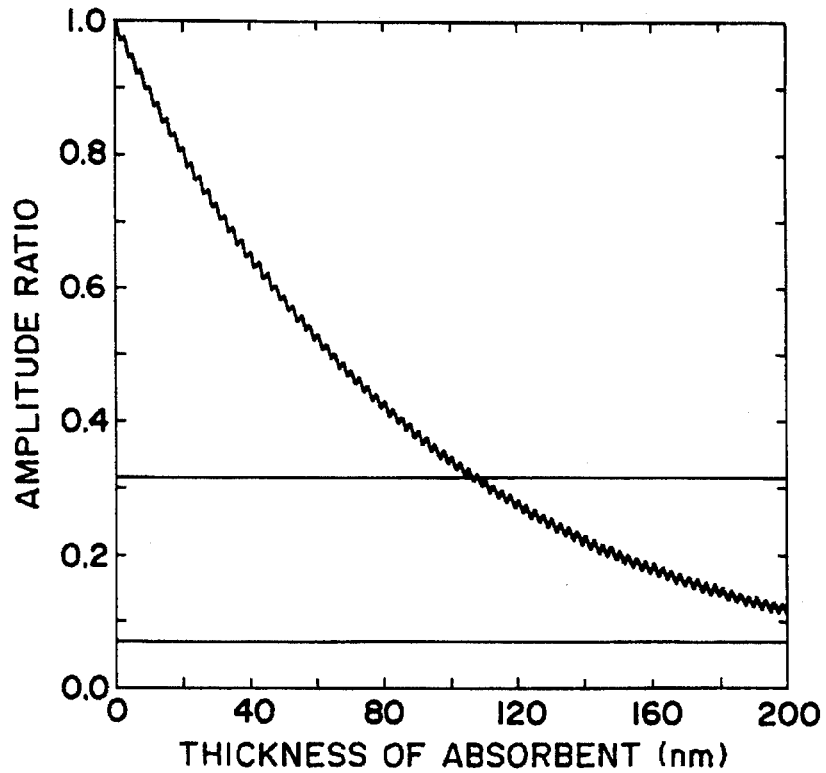
FIG. 14A is a graph showing changes in ratio of amplitude between the light transmitted through an absorbent and then reflected and the light directly reflected, with respect to the changing thickness of the absorbent, in a case where the used wavelength is 5 nm and the absorbent comprises Si and is provided on Cr/C multilayered film.
Figure 14B:
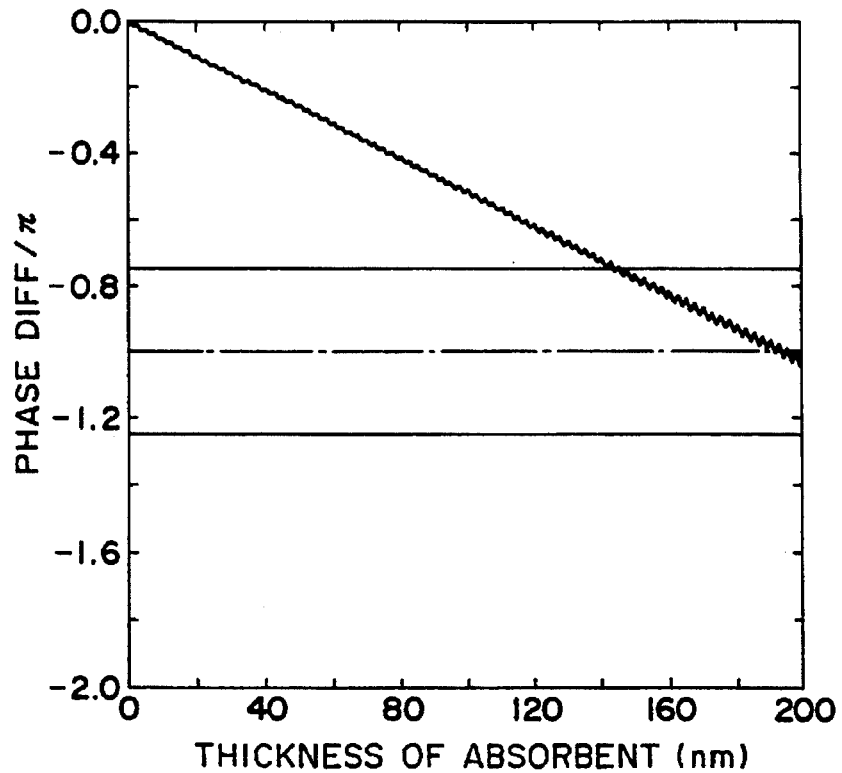
FIG. 14B is a graph similar to FIG. 14A, but showing changes in phase difference between the light transmitted through the absorbent and then reflected and the light directly reflected.

FIGS. 14A and 14B are similar graphs in an occasion where a Si layer is formed as an absorbent material upon a reflection film of Cr/C multilayer. FIGS. 15A and 15B are similar graphs in an occasion where an alloy of Pt and Ru is provided as an absorbent material. As described above, Si single element or an alloy of Pt and Ru has an optical constant suitable for an absorbent material. It is seen from these drawings that a preferable absorbent material for a 5 nm half tone type mask is attainable with Si of a thickness of about 190 nm or with a Pt-Ru alloy of a thickness of 110 nm.

FIGS. 16A and 16B are graphs showing amplitude ratio and phase difference/π in an occasion where a Ta layer is provided as an absorbent material upon Cr/C multilayer. As described, Ta single element is not suited for an absorbent material of a half tone reflection type mask. An appropriate amplitude ratio is taken with a thickness of not greater than 80 nm, but an appropriate value of phase difference/π is taken with a thickness not less than 80 nm. Thus, it is seen that there is no range in which both of these conditions are satisfied.

As described hereinbefore, the present invention enables to specify the material of and the thickness of an absorbent material for a half tone reflection type mask. Based on this, the invention effectively solves the problem of pattern distortion due to thermal distortion of a transmissive film of a transmission type mask, and additionally the invention makes it easy to provide a reflection type mask with reduced shading at the reflecting portion which otherwise might be produced due to the thickness of the absorbent material. Further, because the mask is of phase shift type, enhanced resolution imaging is attainable with an optical system of the same numerical aperture. Moreover, the invention assured other advantageous effects of improved linewidth precision or registration precision.

Next, an embodiment of a device manufacturing method which uses a mask or an exposure apparatus as described hereinbefore, will be explained.

Figure 18:
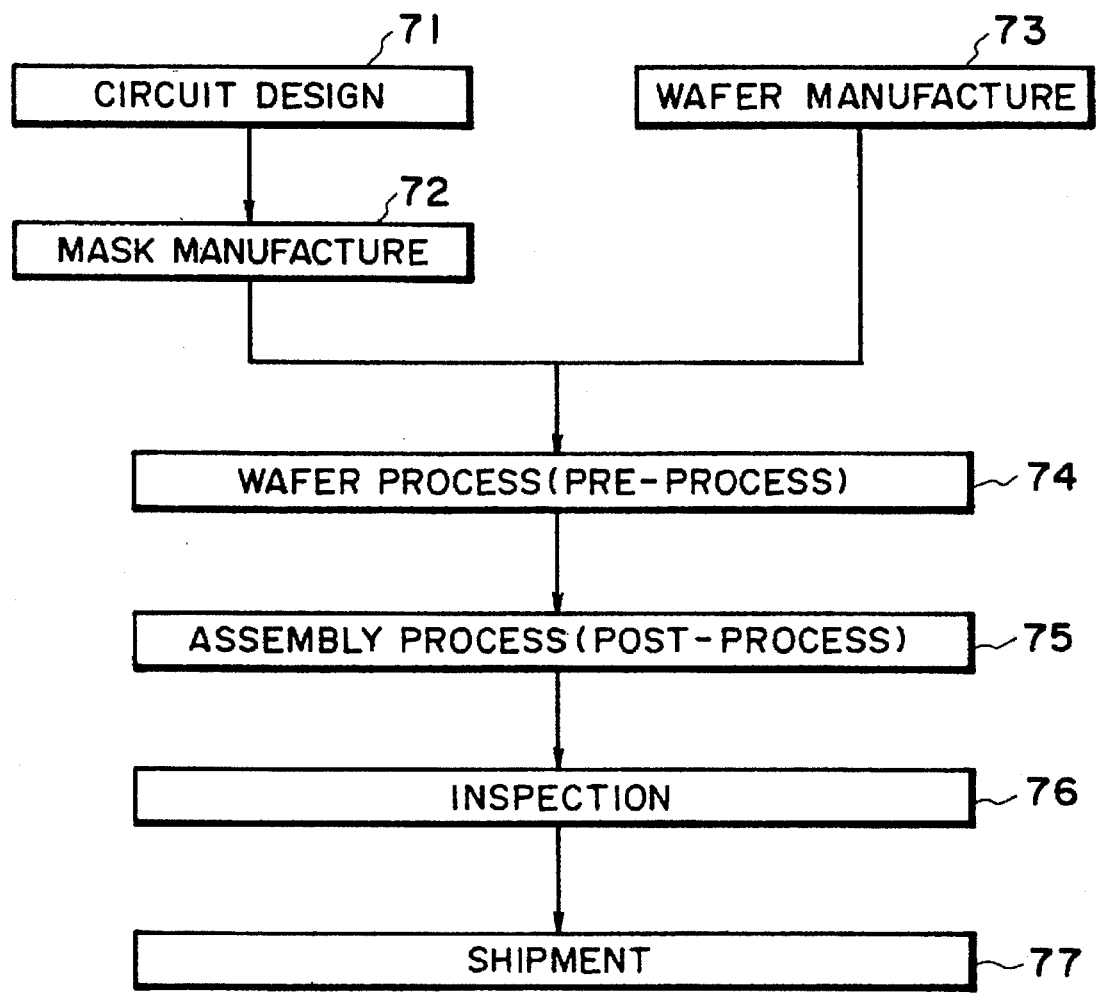
FIG. 18 is a flow chart of semiconductor device manufacturing processes.

FIG. 18 is a flow chart of the sequence of manufacturing a semiconductor device such as a semiconductor chip (e.g. IC or LSI), a liquid crystal panel or a CCD, for example. Step 1 is a design process for designing the circuit of a semiconductor device. Step 2 is a process for manufacturing a mask on the basis of the circuit pattern design. Step 3 is a process for manufacturing a wafer by using a material such as silicon.

Step 4 is a wafer process which is called a pre-process wherein, by using the so prepared mask and wafer, circuits are practically formed on the wafer through lithography. Step 5 subsequent to this is an assembling step which is called a post-process wherein the wafer processed by step 4 is formed into semiconductor chips. This step includes assembling (dicing and bonding) and packaging (chip sealing). Step 6 is an inspection step wherein operability check, durability check and so on of the semiconductor devices produced by step 5 are carried out. With these processes, semiconductor devices are finished and they are shipped (step 7).

Figure 19:
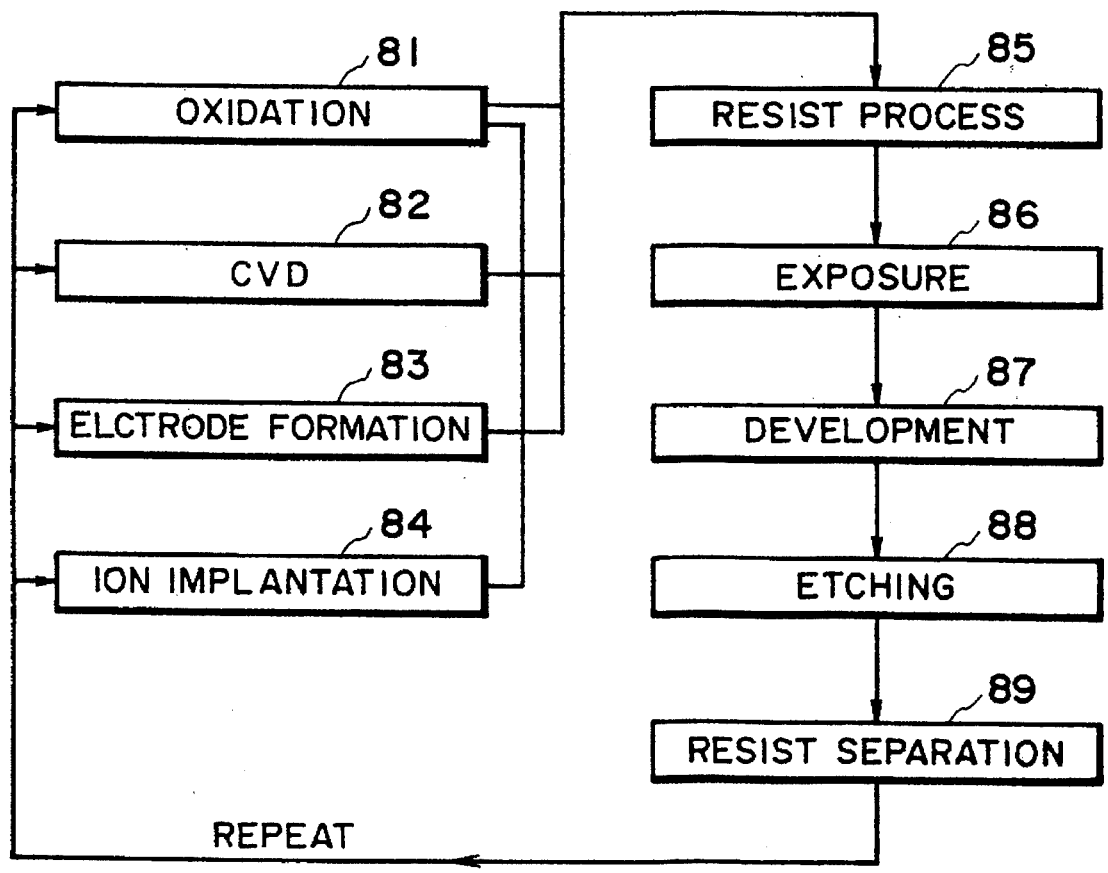
FIG. 19 is a flow chart of a wafer process.
Figure 20:
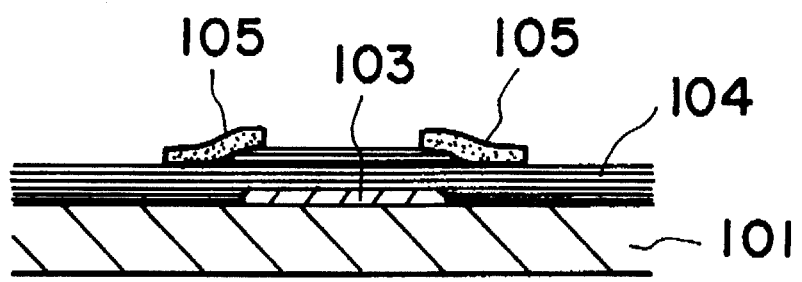
FIG. 20 is a sectional view of a known phase shift reflection type mask.
Figure 21:
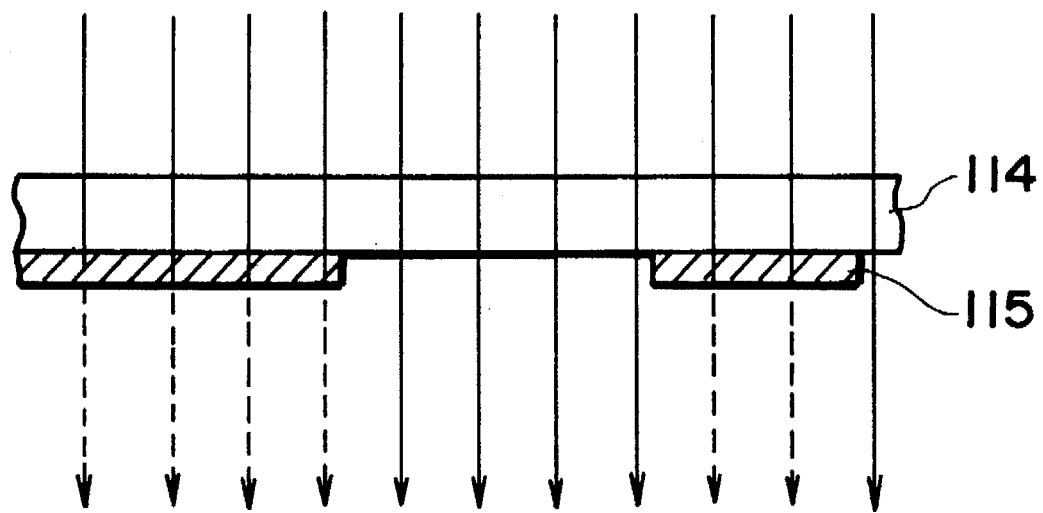
FIG. 21 is a sectional view of a known phase shift transmission type mask.

FIG. 19 is a flow chart showing details of the wafer process. Step 11 is an oxidation process for oxidizing the surface of a wafer. Step 12 is a CVD process for forming an insulating film on the wafer surface. Step 13 is an electrode forming process for forming electrodes on the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

While the invention has been described with reference to the structures disclosed herein, it is not confined to the details set forth and this application is intended to cover such modifications or changes as may come within the purposes of the improvements or the scope of the following claims.

What is claimed is:

1. A reflection mask, comprising:
   a reflective portion effective to reflect soft X-rays or vacuum ultraviolet rays; and
   an absorbent material pattern formed on said reflecting portion;
   wherein, when the wavelength of the soft X-rays or vacuum ultraviolet rays is denoted by λ and the optical constant of the material constituting said absorbent material pattern is denoted by $1-\delta-ik$ (where $\delta$ and $k$ are real numbers while $i$ is an imaginary number), a relation $0.29<k/|\delta|<1.12$ is satisfied, and wherein the thickness d of said absorbent pattern satisfies a relation $3\lambda/(16|\delta|)<d<5\lambda/(16|\delta|)$.

2. A reflection mask according to claim 1, wherein, when the wavelength of the soft X-rays or vacuum ultraviolet rays is denoted by $\lambda$(nm), a relation $k>0.0004\lambda$ is satisfied.

3. A reflection mask according to claim 1, wherein the wavelength of the soft X-rays or vacuum ultraviolet rays is near 13 nm, and wherein said absorbent material pattern comprises one of single elements of V, Cr, Mn, Fe, Co, Ag, Cd, In, Sn, Sb, lanthanoid, Hf, Ta, W, Re, Os, Ir, Pt, Au, Ti, Pb and Bi, or a substance containing at least one of them.

4. A reflection mask according to claim 1, wherein the wavelength of the soft X-rays or vacuum ultraviolet rays is near 13 nm, and wherein said absorbent material pattern comprises a substance containing both of at least one of elements of an element group of B, C, Ti, Zr, Mo, Ru, Rh and Pd and at least one of elements of an element group of Ca, Mg, Al, Ni, Cu, Zn, Ga, Ge, As, Se and Te.

5. A reflection mask according to claim 1, wherein the wavelength of the soft X-rays or vacuum ultraviolet rays is near 5 nm, and wherein said absorbent material pattern comprises one of single elements of Mg, Al, Si, Cr, Mn, Fe, Co, Ni, Cu, Zn, Ga, Ge, As, Se, Rh, Pd, Ag, lanthanoid, Hf, Au, Pb and Bi, or a substance containing at least one of them.

6. A reflection mask according to claim 1, wherein the wavelength of the soft X-rays or vacuum ultraviolet rays is near 5 nm, and wherein said absorbent material pattern comprises a substance containing both of at least one of elements of an element group of Ca, Sc, Ti, V, Ru, Cd, In, Sn, Sb, Te and Ba and at least one of elements of an element group of Y, Zr, Nb, Mo, Ta, W, Re, Os, Ir and Pt.

7. A reduction projection exposure apparatus, comprising:

an illumination optical system for projecting soft X-rays or vacuum ultraviolet rays to a reflection type mask; and an imaging optical system for projecting, to a wafer and in a reduced scale, soft X-rays or vacuum ultraviolet rays reflected by the reflection type mask;

wherein the reflection type mask comprises a reflective portion effective to reflect soft X-rays or vacuum ultraviolet rays, an absorbent material pattern formed on said reflecting portion, wherein, when the wavelength of the soft X-rays or vacuum ultraviolet rays is denoted by $\lambda$ and the optical constant of the material constituting said absorbent material pattern is denoted by $1-\delta-ik$ (where $\delta$ and $k$ are real numbers while $i$ is an imaginary number), a relation $0.29<k/51\ \delta|<1.12$ is satisfied, and wherein the thickness d of said absorbent pattern satisfies a relation $3\lambda/(16|\delta|)<d<5\lambda/(16|\delta|)$.

8. An apparatus according to claim 7, wherein, when the wavelength of the soft X-rays or vacuum ultraviolet rays is denoted by $\lambda$ (nm), a relation $k>0.0004\%$ is satisfied.

9. An apparatus according to claim 7, wherein the wavelength of the soft X-rays or vacuum ultraviolet rays is near 13 nm, and wherein said absorbent material pattern comprises one of single elements of Sc, Ti, V, Cr, Mn, Fe, Co, Pd, Ag, Cd, In, Sn, Sb, lanthanoid, Hf, Ta, W, Re, Os, Ir, Pt, Au, Ti, Pb and Bi, or a substance containing at least one of them.

10. An apparatus according to claim 7, wherein the wavelength of the soft X-rays or vacuum ultraviolet rays is near 13 nm, and wherein said absorbent material pattern comprises a substance containing both of at least one of elements of an element group of B, C, Zr, Mo, Ru and Rh and at least one of elements of an element group of Ca, Mg, Al, Ni, Cu, Zn, Ga, Ge, As, Se and Te.

11. An apparatus according to claim 7, wherein the wavelength of the soft X-rays or vacuum ultraviolet rays is near 5 nm, and wherein said absorbent material pattern comprises one of single elements of Mg, Al, Si, Fe, Co, Ni, Cu, Zn, Ga, Ge, As, Se, lanthanoid, Hf, Au, Pb and Bi, or a substance containing at least one of them.

12. An apparatus according to claim 7, wherein the wavelength of the soft X-rays or vacuum ultraviolet rays is near 5 nm, and wherein said absorbent material pattern comprises a substance containing both of at least one of elements of an element group of Ca, Sc, Ti, V, Cr, Mn, Ru, Rh, Pd, Ag, Cd, In, Sn, Sb, Te and Ba and at least one of elements of an element group of Y, Zr, Nb, Mo, Ta, W, Re, Os, Ir and Pt.

13. A reflection mask, comprising:

a reflective portion effective to reflect a radiation beam; and a pattern material formed on said reflective portion;

wherein, when the radiation beam has a wavelength $\lambda$ and said pattern material has an optical constant $1-\delta-ik$, where $\delta$ and $k$ are real numbers while $i$ is an imaginary number, at least one of (a) a relation $0.29<k/|\delta|<1.12$ and (b) a relation $3\lambda/(16|\delta|)<d<5\lambda/(16|\delta|)$, where d is the thickness of said pattern material, is satisfied.

14. A reflection mask according to claim 13, wherein a relation $k>0.0004\lambda$ is satisfied.

15. A method of manufacturing a microdevice, comprising the step of using the reflection mask as recited in claim 13 to transfer a pattern related to the pattern material onto a substrate.

* * * * *

UNITED STATES PATENT AND TRADEMARK OFFICE
CERTIFICATE OF CORRECTION

PATENT NO. : 5,641,593

DATED : June 24, 1997

INVENTOR(S) : YUTAKA WATANABE, ET AL.

Page 1 of 2

It is certified that error appears in the above-identified patent and that said Letters Patent is hereby corrected as shown below:

ON THE TITLE PAGE, ITEM [57] ABSTRACT
  Line 10, "$3\delta/(16|\delta|)$" should read --$3\lambda/(16|\delta|)$ COLUMN 3
  Line 38, "$3\delta/(16|\delta|)$" should read --$3\lambda/(16|\delta|)$--.

COLUMN 6
  Line 25 "$4 1|\delta|d/\lambda=1$" should read --$4|\delta|d/\lambda=1$--.

COLUMN 7
  Line 24, "0,005-0.1" should read --0.005-0.1--;
  Line 37, "mirror 8" should read --mirrors 8--;
  Line 45, "mirror 21" should read --mirrors 21--.

COLUMN 8
  Line 8, "and and" should read --and the--;
  Line 18, "patters 3" should read --pattern 3--;
  Line 51, "become" should read --becomes--;
  Line 67, "defines" should read --define--.

COLUMN 10
  Line 2, "line" should read --lines--.

UNITED STATES PATENT AND TRADEMARK OFFICE
CERTIFICATE OF CORRECTION

PATENT NO. : 5,641,593

DATED : June 24, 1997

INVENTOR(S) : YUTAKA WATANABE, ET AL.

It is certified that error appears in the above-identified patent and that said Letters Patent is hereby corrected as shown below:

<u>COLUMN 13</u>
  Line 13, "Ti," should read --Tl,--;
  Line 51, "0.29<k/51 δ|<1.12" should read
    --0.29<k/|δ|<1.12--.

<u>COLUMN 14</u>
  Line 5, "k>0.0004%" should read --k>0.0004λ--;
  Line 11, "Ti," should read --Tl,--;

Line 40, "Where" should read --where--;

Signed and Sealed this

Tenth Day of March, 1998

*Attest:*

BRUCE LEHMAN

*Attesting Officer*      Commissioner of Patents and Trademarks